(12) United States Patent
Walker et al.

(10) Patent No.: US 6,888,750 B2
(45) Date of Patent: May 3, 2005

(54) NONVOLATILE MEMORY ON SOI AND COMPOUND SEMICONDUCTOR SUBSTRATES AND METHOD OF FABRICATION

(75) Inventors: Andrew J. Walker, Mountain View, CA (US); Mark G. Johnson, Los Altos, CA (US); N. Johan Knall, Sunnyvale, CA (US); Igor G. Kouznetsov, Santa Clara, CA (US); Christopher J. Petti, Mountain View, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 260 days.

(21) Appl. No.: 09/927,642

(22) Filed: Aug. 13, 2001

(65) Prior Publication Data

US 2001/0055838 A1 Dec. 27, 2001

Related U.S. Application Data

(63) Continuation-in-part of application No. 09/814,727, filed on Mar. 21, 2001, now Pat. No. 6,420,215, which is a continuation of application No. 09/560,626, filed on Apr. 28, 2000, now abandoned.

(51) Int. Cl.$^7$ .............................. G11C 5/02; G11C 16/00
(52) U.S. Cl. ................................... 365/185.05; 365/51
(58) Field of Search .................. 365/185.01, 185.05, 365/185.06, 185.11, 185.12, 185.13, 185.14, 185.23, 185.26, 51, 72, 105, 175, 63, 94, 96, 97, 100, 103, 104, 129, 130, 173, 174, 176, 180; 257/204, 208, 209, 211

(56) References Cited

U.S. PATENT DOCUMENTS 3,414,892 A 12/1968 McCormack et al.

(Continued)

FOREIGN PATENT DOCUMENTS

| EP | 0 073 486 A2 | 8/1982 |
|----|--------------|--------|
| EP | 0 387 834 A2 | 9/1990 |
| EP | 0387834 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| JP | 61-222216 | 10/1986 |
| JP | 5-082787 | 4/1993 |
| JP | 6-22352 | 1/1994 |
| JP | 6-338602 | 12/1994 |
| JP | 63-52463 | 3/1998 |
| WO | WO 94/26083 | 11/1994 |

OTHER PUBLICATIONS

IEEE 100—The Authoritative Dictionary of IEEE Standards Terms, 7$^{th}$ Edition, Standards Information Network, IEEE Press, 2000, p. 339.*

C. Hayzelden et al.: "Silicide Formation and Silicide–Mediated Crystallization of Nickel–Implanted Amorphous Silicon Thin Films," J. Appl. Phys., Jun. 15, 1993, pp. 8279–8289, 73 (12), 1993 American Institute of Physics.

David Burnett et al.: "An Advanced Flash Memory Technology on SOI," 1998, pp. 983–986, IEEE.

(Continued)

*Primary Examiner*—Evan Pert
(74) *Attorney, Agent, or Firm*—Pamela J. Squyres

(57) ABSTRACT

A nonvolatile memory array is provided. The array includes an array of nonvolatile memory devices, at least one driver circuit, and a substrate. The at least one driver circuit is not located in a bulk monocrystalline silicon substrate. The at least one driver circuit may be located in a silicon on insulator substrate or in a compound semiconductor substrate.

20 Claims, 13 Drawing Sheets

U.S. PATENT DOCUMENTS

| | | |
|---|---|---|
| 3,432,827 A | 3/1969 | Sarno |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,686,758 A | 8/1987 | Liu et al. |
| 4,692,994 A | 9/1987 | Moniwa et al. |
| 4,710,798 A | 12/1987 | Marcantonio |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,160,987 A | 11/1992 | Pricer et al. |
| 5,191,405 A | 3/1993 | Tomita et al. |
| 5,191,551 A | 3/1993 | Inoue |
| 5,202,754 A | 4/1993 | Bertin et al. |
| 5,266,912 A | 11/1993 | Kledzik |
| 5,283,458 A | 2/1994 | Stokes et al. |
| 5,283,468 A | 2/1994 | Kondo |
| 5,306,935 A | 4/1994 | Esquivel et al. |
| 5,311,039 A | 5/1994 | Kimura et al. |
| 5,321,286 A | 6/1994 | Koyama et al. |
| 5,334,880 A | 8/1994 | Abadeer et al. |
| 5,379,255 A | 1/1995 | Shah |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,663 A | 11/1995 | Bertin et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,517,044 A | 5/1996 | Koyama |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,747,846 A * | 5/1998 | Iida et al. .................. 257/314 |
| 5,751,012 A | 5/1998 | Wolstenholme et al. |
| 5,768,192 A | 6/1998 | Eitan |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,825,046 A | 10/1998 | Czubatyj et al. |
| 5,835,396 A | 11/1998 | Zhang |
| 5,883,409 A | 3/1999 | Guterman et al. |
| 5,915,167 A | 6/1999 | Leedy |
| 5,966,603 A | 10/1999 | Eitan |
| 5,969,380 A | 10/1999 | Syyedy |
| 5,973,356 A | 10/1999 | Noble |
| 5,976,953 A | 11/1999 | Zavracky et al. |
| 5,978,258 A | 11/1999 | Manning |
| 5,985,693 A | 11/1999 | Leedy |
| 6,028,326 A | 2/2000 | Uochi et al. |
| 6,034,882 A | 3/2000 | Johnson et al. |
| 6,057,598 A | 5/2000 | Payne et al. |
| 6,066,547 A | 5/2000 | Maekawa |
| 6,072,193 A | 6/2000 | Ohnuma et al. |
| 6,072,234 A | 6/2000 | Camien et al. |
| 6,075,719 A | 6/2000 | Lowrey et al. |
| 6,087,674 A | 7/2000 | Ovshinsky et al. |
| 6,087,722 A | 7/2000 | Lee et al. |
| 6,133,640 A | 10/2000 | Leedy |
| 6,137,718 A | 10/2000 | Reisinger |
| 6,141,241 A | 10/2000 | Ovshinsky et al. |
| 6,185,122 B1 | 2/2001 | Johnson et al. |
| 6,197,641 B1 | 3/2001 | Hergenrother et al. |
| 6,208,545 B1 | 3/2001 | Leedy |
| 6,281,042 B1 | 8/2001 | Ahn et al. |
| 6,291,858 B1 | 9/2001 | Ma et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,337,521 B1 | 1/2002 | Masuda |

| | | |
|---|---|---|
| 6,351,028 B1 | 2/2002 | Akram |
| 6,353,265 B1 | 3/2002 | Michii |
| 6,355,501 B1 | 3/2002 | Fung et al. |
| 2001/0033030 A1 | 10/2001 | Leedy |
| 2001/0054759 A1 | 12/2001 | Nishiura |
| 2001/0055838 A1 | 12/2001 | Walker et al. |
| 2002/0024146 A1 | 2/2002 | Furusawa |
| 2002/0027275 A1 | 3/2002 | Fujimoto et al. |
| 2002/0028541 A1 | 3/2002 | Lee et al. |
| 2002/0030262 A1 | 3/2002 | Akram |
| 2002/0030263 A1 | 3/2002 | Akram |

OTHER PUBLICATIONS

A. Chatterjee et al.: "Sub–100nm Gate Length Metal Gate NMOS Transistors Fabricated by a Replacement Gate Process," 1997, pp. 821–824, IEEE.

A. Chatterjee et al.: "CMOS Metal Replacement Gate Transistors Using Tantalum Pentoxide Gate Insulator," 1998, pp. 777–780, IEEE.

David K. Y. Lui et al.: "Scaled Dielectric Antifusion Structure for Field–Programmable Gate Array Applications," IEEE Electron Device Letters, Apr. 1991, pp. 151–153, vol. 12, No. 4, IEEE.

Singh Jagar et al.: "Characterization of MOSFET's Fabricated on Large–Grain Polysilicon on Insulator," Solid–State Electronics 45, 2001, pp. 743–749, Elsevier Science Ltd.

Zhonghe Jin et al.: "The Effects of Extended Heat Treatment on Ni Induced Lateral Crystallization of Amorphous Silicon Thin Films," IEEE Transactions on Electron Devices, vol. 46, No. 1, Jan. 1999, pp. 78–82, IEEE.

A. Sato. Et al. "A 0.5–$\mu$m EEPROM Cell Using Poly–Si TFT Technology," IEEE Transactions on Electron Devices, vol. 40, No. 11, Nov. 1993, p. 2126.

Vivek Subramanian et al.: "High–Performance Germanium––Seeded Laterally Crystallized TFT's for Vertical Device Integration," IEEE Transactions on Electron Devices, vol. 45, No. 9, Sep. 1998, pp. 1934–1939, IEEE.

Vivek Subramanian et al. "Low–Leakage Germanium––Seeded Laterally–Crystallized Single–Grain 100–nm TFT's for Vertical Integration Applications," IEEE Electron Device Letters, vol. 20, No. 7, Jul. 1999, pp. 341–343, IEEE.

K.S. Kim et al.: "A Novel Dual String NOR (DuSNOR) Memory Cell Technology Scalable to the 256 Mbit and 1 Gbit Flash Memories," IEDM, 1995, pp. 263–266, IEEE.

Boaz Eitan et al.: "NROM: A Novel Localized Trapping, 2–Bit Nonvolatile Memory Cell," IEEE Electron Device Letters, vol. 21, No. 11, Nov. 2000, pp. 543–545, IEEE.

Marvin H. White et al.: "A Low Voltage SONOS Nonvolatile Semiconductor Memory Technology," IEEE Transaction on Components, Packaging, and Manufacturing Technology, Part A., vol. 20, No. 2, Jun. 1997, pp. 190–195, IEEE.

Min–Hwa Chi et al.: "Programmable and Erase with Floating–Body for High Density Low Voltage Flash EEPROM Fabricated on SOI Wafers," Proceedings 1995 IEEE International SOI Conference, Oct. 1995, pp. 129–130.

S. Koyama: "A Novel Cell Structure for Giga–bit EPROMs and Flash Memories Using Polysilicon Thin Film Transistors," Symposium on VLSI Technology Digest of Technical Papers, 1992, pp. 44–45, IEEE.

Hongmei Wang et al.: "Submicron Super TFT's for 3–D VLSI Applications," IEEE Electron Device Letters, Sep. 2000, pp. 439–441, vol. 21, No. 9, IEEE.

K.W. Lee et.al.: "Three Dimesnional Shared Memory Fabricated Using Wafer Stacking Technology," 2000, IEEE.

John R. Lindsey et al.: "Polysilicon Thin Film Transistor for Three Dimensional Memory," Electrochemical Society Meeting 198th, Oct. 2000, Phoenix, AZ.

Seiichi Aritome: "Advanced Flash Memory Technology and Trends for File Storage Application," IEEE, 2000.

Toshiaki Yamanaka et al.: "Advanced TFT SRAM Cell Technology Using a Phase–Shift Lithography," IEEE Transactions on Electron Devices, Jul. 1995, pp. 1305–1313, vol. 42, No. 7, IEEE.

Sung–Hoi Hur et al.: "A Poly–Si Thin–Film Transistor EEPROM Cell with a Folded Floating Gate," IEEE Transactions on Electron Devices, Feb. 1999, pp. 436–438, vol. 46, No. 2, IEEE.

Jung–Dal Choi et al.: "A 0.15 $\mu$m NAND Flash Technology with 0.11 um$^2$ Cell Size for 1 Gbit Flash Memory," IEEE, 2000.

H. Shirai et al.: "A 0.54 $\mu$m$^2$ Self–Aligned, HSG Floating Gate Cell (SAHF Cell) for 256Mbit Flash Memories," IEEE, 1995, pp. 653–656.

Takuya Kitamura et al.: "A Low Voltage Operating Flash Memory Cell with High Coupling Ratio Using Horned Floating Gate with Fine HSG," IEEE, 1998, pp. 104–105.

Ken Takeuchi et al.: "A Dual–Page Programming Scheme for High–Speed Multigigabit–Scale NAND Flash Memories," IEEE Journal of Solid–State Circuits, May 2001, pp. 744–751, vol. 36, No. 5, IEEE.

John H. Douglas: "The Route to 3–D Chips," High Technology, Sep. 1983, pp. 55–59, vol. 3, No. 9, High Technology Publishing Corporation, Boston, MA.

M. Arienzo et al.: "Diffusion of Arsenic in Bilayer Polycrystalline Silicon Films," J. Appl. Phys., Jan. 1984, pp. 365–369, vol. 55, No. 2, American Institute of Physics.

O. Bellezza et al.: "A New Self–Aligned Field Oxide Cell for Multimegabit Eproms," IEDM, pp. 579–582, IEEE.

S.D. Brotherton et al.: "Excimer–Laser–Annealed Poly–Si Thin–Film Transistors," IEEE Transactions on Electron Devices, Feb. 1993, pp. 407–413, vol. 40, No. 2, IEEE.

P. Candelier et al.: "Simplified 0.35–$\mu$m Flash EEPROM Process Using High–Temperature Oxide (HTO) Deposited by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon Thin––Film Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BIC-MOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "Multilevel Flash cells and their Trade–offs," IEEE Electron Device Letters , pp. 169–172, 1996, IEEE.

Dr. Heinrich Endert: "Excimer Lasers as Tools for Material Processing in Manufacturing," Technical Digest: International Electron Devices Meeting, 1985, pp. 28–29, Washington, DC, Dec. 1–4, 1985, Göttingen, Germany.

Dov Frohman–Bentchkowsky: "A Fully Decoded 2048–Bit Electrically Programmable FAMOS Read–Only Memory," IEEE Journal of Solid–State Circuits, pp. 301–306, vol. sc–6, No. 5, Oct. 1971.

G.K. Giust et al.: "Laser–Processed Thin–Film Transistors Fabricated from Sputtered Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering" IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

Fumihiko Hayashi et al.: "A Self–Aligned Split–Gate Flash EEPROM Cell with 3–D Pillar Structure," 1999 Symposium on VLSI Technology Digest of Technical Papers, pp. 87–88, Stanford University, Stanford, CA 94305, USA.

Stephen C.H. Ho et al.: "Thermal Stability of Nickel Silicides in Different Silicon Substrates," Department of Electrical and Electronic Engineering, pp. 105–108, 1998, IEEE.

J. Esquivel et al. "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8μm Process for Very High Density Applications, IEDM 91, pp. 311–314, 1991, IEEE.

Chang–Dong Kim et al.: "Short–Channel Amorphous–Silicon Thin–Film Transistors," IEEE Transactions on Electron Devices, pp. 2172–2176, vol. 43, No. 12, Dec. 1996, IEEE.

Johan H. Klootwijk et al.: "Deposited Inter–Polysilicon Dielectrics for Nonvolatle Memories," IEEE Transactions on Electron Devices , pp. 1435–1445, vol. 46, No. 7, Jul. 1999, IEEE.

Ja–Hum Ku et al.: "High Performance pMOSFETs With Ni(Si/sub x/Ge/sub 1–x Di/Sub 0.8/Ge/sub 0.2/ gate, IEEE Xplore Citation," VLSI Technology, 200. Digest of Technical Paper Symposium on page(s): 114–115 Jun. 13–15 2000.

Nae–In Lee et al.: "High–Performance EEPROM's Using N– and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Heating and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27 1995, American Institute of Physics.

K. Miyashita etal.: "Optimized Halo Structure for 80 nm Physical Gate CMOS Technology with Indium and Antimony Highly Angled Ion Implantation," IEDM 99–645, pp. 27.2.1–27.2.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Noriaki Sato et al.: "A New Programmable Cell Utilizing Insulator Breakdown," IEDM 85, pp. 639–642, 1985, IEEE.

Takeo Shiba et al.: "In Situ Phosphorus–Doped Polysilicon Emitter Technology for Very High–Speed, Small Emitter Bipolar Transistors," IEEE Transactions on Electron Devices , pp. 889–897, vol. 43, No. 6, Jun. 1996, IEEE.

Seungheon Song et al.: "High Performance Transistors with State–of–the–Art CMOS Technologies," IEDM 99, pp. 427–430, 1999, IEEE.

Yoshihiro Takao et al."Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point Defect–Based Impurity Diffusion Model," IEEE Transactions on Computer–Aided Design , pp. 1177–1183, vol. 9, No. 11, Nov. 1990, IEEE.

Hongmei Wang et al.: "Submicron Super TFTs for 3–D VLSI Applications," IEEE Electron Device Letters, vol. 21, No. 9, pp. 439–441, Sep. 2000, IEEE.

Hongmei Wang et al.: "Super Thin–Film Transistor with SOI CMOS Performance Formed by a Novel Grain Enhancement Method," IEEE Transactions on Electron Devices, pp. 1580–1586, vol. 47, No. 8, Aug. 2000, IEEE.

Marvin H. White et al."On the Go With Sonos," Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Qi Xiang et al.: "Deep sub–100 nm CMOS with Ultra Low Gate Sheet Resista NiSi," VLSI Technology, 2000. Digest of Technical Paper Symposium on . . . pp. 76–77, IEEE Xplore, Jun. 13–15, 2000.

Qi Xiang et al."Deep Sub–100nm CMOS with Ultra Low Gate Sheet Resistance by NiSi," IEEE, pp. 76–77, 2000, Symposium on VLSI Technology Digest of Technical Papers.

Qiuxia Xu et al.: "New Ti–SALICIDE Process Using Sb and Ge Preamorphization for Sub–0.2 μm CMOS Technology," IEEE Transactions on Electron Devices, pp. 2002–2009, vol. 45, No. 9, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

Qi Xiang et al.: "Deep Sub–100nm CMOS with Ultra Low Gate Sheet Resistance by NiSi," pp. 76–77, 2000 Symposium on VLSI Technology Digest of Technical Papers.

Vivek Subramanian: "Control of Nucleation and Grain Growth in Solid–Phase Crystallized Silicon for High–Performance Thin Film Transistors," A Dissertation submitted to the Department of Electrical Engineering and the Committee of Graduate Studies of Stanford University, 1998.

Dietmar Gogl et al.: "A 1–Kbit EEPROM in SIMOX Technology for High–Temperature Applications up to 250° C," IEEE Journal of Solid–State Circuits, Oct. 2000, vol. 35, No. 10, IEEE.

"3D Chip–On–Chip Stacking", Semiconductor International, Dec. 1991.

Lay, Richard, "TRW Develops Wireless Multiboard Interconnect System", Electronic Engineering Times, Nov. 5, 1994.

Wada Y. et al., "Active–Body–Bias SOI–CMOS Driver Circuits", Jun. 1997 Symposium on VLSI Circuits Digest of Technical Papers, pp. 29–30.

Abou–Samra S.J.: "3D CMOS SOI for High Performance Computing", Low Power Electronics and Design Proceedings, 1998.

Yamazaki K.: "4–Layer 3–D IC Technologies for Parallel Signal Processing", International Electron Devices Meeting Technical Digest, Dec. 9–12, 1990, pp. 25.51–25.5.4.

Schlaeppi H.P.: "nd Core Memories using Multiple Coincidence", IRE Transactions on Electronic Computers, Jun. 1960, pp. 192–196.

Schlaeppppi H.P.: "Session V: Information Storage Techniques", International Solid–State Circuits Conference, Feb. 11, 1960, pp. 54–55.

De Graaf C. et al.: "A Novel High–Density, Low–Cost Diode Programmable Read Only Memory," IEDM, beginning at p. 189.

Peter K. Naji et al.: "A 256kb 3.0V 1T1MTJ Nonvolatile Magnetoresistive RAM," 2001 IEEE International Solid-–State Circuits Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95,4040–405 (enlargements of slides submitted, totaling 25 pages).

Kim C. Hardee et al.: "A Fault–Tolerant 30 ns/375 mW 16K×1 NMOS Static RAM," IEEE Journal of Solid–State Circuits, Oct. 1981, vol. SC–16, No. 5, pp. 435–443.

Toshio Wada et al.; "A 15–ns 1024–Bit Fully Static MOS RAM," IEEE Journal of Solid–State Circuits, Oct. 1978, vol. SC–13, No. 5, pp. 635–639.

Camperi–Ginestet C.: "Vertical Electrical Interconnection of Compound Semiconductor Thin–Film Devices to Underlying Silicon Circuitry", IEEE Photonics Technology Letters, vol. 4, No. 9, Sep. 1992, pp. 1003–1006.

Akasaka Yoichi: Three–dimensional Integrated Circuit: Technology and Application Prospect, Microelectronics Journal, vol. 20, No.s 1–2, 1989, pp. 105–112.

Sakamoto Koji: "Architecture des Circuits a Trois Dimension (Architecture of Three Dimensional Devices)", Bulletin of the Electrotechnical Laboratory, ISSN 0366–9092, vol. 51, No. 1, 1987, pp. 16–29.

Akasaka Yoichi: "Three–dimensional IC Trends", Proceedings of the IEEE, vol. 74, No. 12, 1986, pp. 1703–1714.

Carter William H.: "National Science Foundation (NSF) Forum on Optical Science and Engineering", Proceedings SPIE—The International Society for Optical Engineering, vol. 2524, Jul. 11–12 1995, (Article by N. Joverst titled "Manufacturable Multi–Materilas Integraton Compound Semi–conductor Devices Bonded to Silicon Circuity".

Hayashi, Y.: "A New Three Dimensional IC Fabrication Technology, Stacking Thin Film Dual–CMOS Layers", IEDM, 1991, pp. 25.6.2–25.6.4.

Reber M.: "Benefits of Vertically Stacked Integrated Circuits for Sequential Logic", IEEE, 1996, pp. 121–124.

Stern Jon M.: Design and Evaluation of an Epoxy Three–dimensional Multichip Module, IEEE Transactions on Components, Packaging, and Manufacturing Technology—Part B, vol. 19, No. 1, Feb. 1996, pp. 188–194.

Bertin Claude L.: "Evaluation of a Three–dimensional Memory Cube System", IEEE Transactions on Components, Hybrids, and Manufacturing Technology, vol. 16, No. 8, Dec. 1993, pp. 1006–1011.

Watanabe Hidehiro: "Stacked Capacitor Cells for High–density Dynamic RAMs", IEDM, 1988, pp. 600–603.

Web Page: "Stacked Memory Modules", IBM Technical Disclosure Bulletin, vol. 38, No. 5, 1995.

Thakur Shashidhar: "An Optimal Layer Assignment Algorithm for Minimizing Crosstalk for Three VHV Channel Routing", IEDM, 1995, pp. 207–210.

Terril Rob: "3D Packaging Technology Overview and Mass Memory Applications", IEDM, 1996, pp. 347–355.

Inoue Y.: "A Three–Dimensional Static RAM", IEEE Electron Device Letters, vol. 7, No. 5, May 1986, pp. 327–329.

Reber M.: "Benefits of Vertically Stacked Integrated Circuits for Sequential Logic", IEDM, 1996, pp. 121–124.

Kurokawa Takakazu: "3–D VLSI Technology in Japan and an Example: A Syndrome Decoder for Double Error Corection", FGCS—Future, Generation, Computer, Systems, vol. 4, No. 2, 1988, pp. 145–155, Amsterdam, The Netherlands.

Makiniak David: "Vertical Ingegration of Silicon Allows Packaging of Extremely Dense System Memory In Tiny Volumes: Memory–chip Stacks Send Density Skyward", Electronic Design, No. 17, Aug. 22, 1994, pp. 69–75, Cleveland Ohio.

Yamazaki K.: "Fabrication Technologies for Dual 4–KBIT Stacked SRAM", IEDM 16.8., 1986, pp. 435–438.

Pein Howard: "Performance of the 3–D PENCIL Flash EPROM Cell an Memory Array", IEEE Transactions on Electron Devices, vol. 42, No. 11, Nov. 1995, pp. 1982–1991.

Abstract Lomatch S.: "Multilayered Josephson Junction Logic and Memory Devices", Proceedings of the SPIE–The International Society for Optical Engineering vol. 2157, pp. 332–343.

Abstract Lu N.C.C.: "Advanced Cell Structures for Dynamic RAMs", IEEE Circuits and Devices Magazine, vol. 5, No. 1, Jan. 1989, pp. 27–36.

Abstract Sakamato K.: "Architecture of Three Dimensional Devices", Journal: Bulletin of the Electrotechnical Laboratory, vol. 51, No. 1, 1987, pp. 16–29.

Abstract "Wide Application of Low–Cost Associative Processing Associative Processing Seen", Electronic Engineering Times, Aug. 26, 1996, p. 43.

Abstract "Interconnects & Packaging", Electronic Engineering Times, Nov. 27, 1995, p. 43.

Abstract "Closing in on Gigabit DRAMs", Electronic Engineering Times, Nov. 27, 1995, p. 35.

Abstract "Module Pact Pairs Cubic Memory with Vision-Tek", Semiconductor Industry & Business Survey, vol. 17, No. 15, Oct. 23, 1995.

Abstract "Layers of BST Materials Push Toward 1Gbit DRAM", Electronics Times, Oct. 19, 1995.

Abstract "Technologies Will Pursue Higher DRAM Densities", Electronic News (1991), Dec. 4, 1994, p. 12.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Astract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1–Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future in 3D", Electronic Engineering Times, Sep. 24, 1990, p. 37.

Chan et al. "Three Dimensional CMOS integrated Circuits on Large Grain Polysilicon Films" IEEE, *Hong Kong University of Science and Technology* 2000 IEEE.

* cited by examiner

NONVOLATILE MEMORY ON SOI AND COMPOUND SEMICONDUCTOR SUBSTRATES AND METHOD OF FABRICATION

This application is a continuation-in-part of U.S. application Ser. No. 09/814,727, filed on Mar. 21, 2001 now U.S. Pat. No. 6,420,215, which is a continuation of U.S. application Ser. No. 09/560,626, filed on Apr. 28, 2000 now abandoned, both of which are incorporated by reference in their entirety.

FIELD OF THE INVENTION

The present invention is directed generally to semiconductor devices and methods of fabrication and more particularly to a nonvolatile memory array and method of fabrication.

BACKGROUND OF THE INVENTION

Field programmable nonvolatile memory arrays such as programmable read only memories (PROMs), electrically programmable read only memories (EPROMs), and electrically erasable programmable read only memories (EEPROMs) require driver circuits (also known as peripheral circuits) which select a particular device in the array to write or read data from the particular device. Frequently, such driver circuits are formed in a bulk monocrystalline silicon substrate, while the memory arrays are formed above the driver circuits. Such a memory array is disclosed in U.S. Pat. Nos. 6,034,882 and 6,185,122, incorporated herein by reference. However, forming the driver circuits in the bulk monocrystalline silicon substrate may be undesirable for some applications of the memory array.

BRIEF SUMMARY OF THE INVENTION

A preferred embodiment of the present invention provides a nonvolatile memory array, comprising an array of nonvolatile memory devices, at least one driver circuit, and a substrate, wherein the at least one driver circuit is not located in a bulk monocrystalline silicon substrate.

Another preferred embodiment of the present invention provides a nonvolatile memory array, comprising a monocrystalline silicon substrate, at least one driver circuit formed above the substrate, and an array of nonvolatile memory devices formed above the substrate.

Another preferred embodiment of the present invention provides a method of making a nonvolatile memory array, comprising forming at least one driver circuit above a substrate or in a semiconductor substrate other than a monocrystalline silicon substrate, and forming an array of nonvolatile memory devices.

DETAILED DESCRIPTION OF THE PREFERRED EMBODIMENTS

The present inventors have realized that the driver circuit of the nonvolatile memory array does not have to be located in a bulk monocrystalline silicon substrate. Instead, the driver circuit may be formed in a silicon on insulator (SOI) substrate or in a compound semiconductor substrate, depending on the type of electronic device in which the array is to be incorporated.

Figure 1:
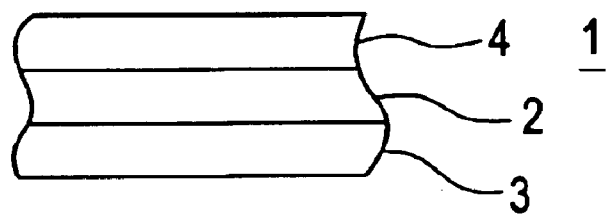
FIGS. 1–3 are schematic side cross sectional views of a memory array according to the first and second preferred embodiments of the invention.

FIG. 1 illustrates a schematic overview of a nonvolatile memory array 1 according to the first preferred embodiment of the present invention. In FIG. 1 at least one driver circuit 2 is formed in an SOI substrate, which contains an insulating surface 3. An array of nonvolatile memory devices 4 is located above the at least one driver circuit 2. Alternatively, the array of nonvolatile memory devices 4 may be located adjacent to or below the driver circuit 2 in the SOI substrate.

Figure 2A:
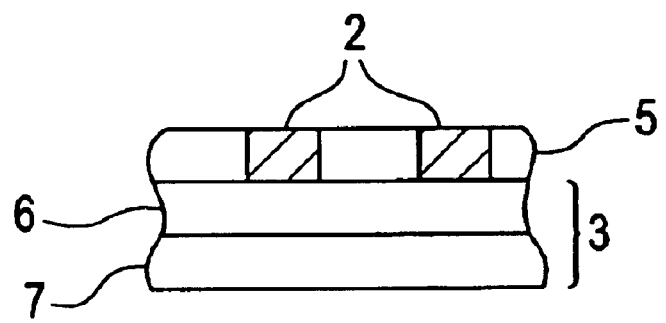
Figure 2B:
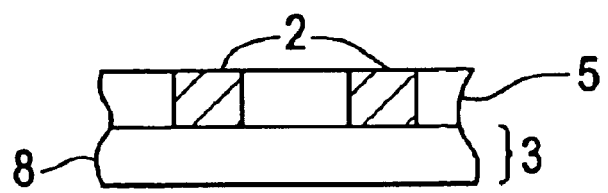

The preferred SOI substrates of the first preferred embodiment are schematically illustrated in FIGS. 2A and 2B. The SOI substrate includes a silicon layer 5 over the insulating surface 3. The silicon layer 5 may be a single crystal silicon layer, a polycrystalline silicon (i.e., "polysilicon") layer or an amorphous silicon layer. The at least one driver circuit 2 is located in the silicon layer 5. If there are a plurality of driver circuits 2 in the silicon layer 5, then the driver circuits may be isolated from each other by field oxides, trench isolation structures and/or any other known isolation structures. The insulating surface 3 below the silicon layer 5 may be an insulating layer 6 formed on or over a semiconductor substrate 7 or an insulating substrate 8, as shown in FIGS. 2A and 2B, respectively.

In a first preferred aspect of the first embodiment, the SOI substrate includes a silicon layer 5 formed on an insulating layer 6, such as silicon oxide, silicon nitride, silicon oxynitride and/or other insulting layers. The insulating layer 6 is located on or over a bulk monocrystalline silicon substrate 7, as shown in FIG. 2A. Thus, the at least one driver circuit 2 is located in layer 5 above the bulk monocrystalline silicon substrate 7.

The SOI substrate (i.e., elements 5, 6, and 7) shown in FIG. 2A may be formed by the SIMOX (separation by implantation of oxygen) method. The SIMOX method includes providing a monocrystalline silicon substrate 7 and implanting oxygen below the surface of the substrate 7. The substrate 7 is then annealed to form a silicon oxide layer 6 in the substrate. Since the oxygen was implanted below the substrate 7 surface, a single crystal silicon layer 5 (which used to comprise the top section of the substrate 7) remains above the silicon oxide layer 6. The at least one driver circuit 2 is then formed in the single crystal silicon layer 5. The at least one driver circuit 2 preferably contains MOS (metal oxide semiconductor) and CMOS (complementary MOS) transistors and is preferably fabricated in substrate using ordinary MOS and CMOS fabrication techniques.

Alternatively, the SOI substrate may be formed by a seeded lateral epitaxy method. In this method, a monocrystalline silicon substrate 7 is provided. An insulating layer 6, such as a silicon oxide layer, is formed over the substrate 7. One or more windows or vias to the substrate 7 are formed in layer 6. A silicon layer 5 is deposited over the silicon oxide layer 6, such that it contacts the substrate 7 through the windows in layer 6. The silicon layer 5 may be deposited as a single crystal silicon layer over the silicon oxide layer using the substrate as a seed. Alternatively, the silicon layer 5 may be deposited as an amorphous or polycrystalline silicon layer, and then recrystallized by laser or thermal annealing into a single crystal layer using the substrate 7 as a seed. Then, the at least one driver circuit 2 is formed in the single crystal silicon layer 5.

Alternatively, the silicon layer 5 may comprise a polycrystalline silicon or an amorphous silicon layer formed over the insulating layer 6. In this case, the insulating layer 6, such as a silicon oxide, silicon nitride or silicon oxynitride interlayer insulating layer is formed over the substrate 7. The polycrystalline or amorphous silicon layer 5 is then deposited over the insulating layer 6, and the driver circuit 2 is formed in the layer 5. If desired, the crystallinity of the layer 5 may be improved by laser and/or thermal annealing. Thus, for example, an amorphous silicon layer may be converted into a polycrystalline silicon layer. If desired, a crystallization catalyst material, such as Ge, or a transition metal, such as Ni, Pt, Pd, etc., or their silicides, may be used as a seed for the crystallization of the amorphous silicon layer.

In a second preferred aspect of the first embodiment, the SOI substrate includes a silicon layer 5 formed on or over an insulating substrate 8, as shown in FIG. 2B. The insulating substrate 8 may be a glass, plastic or ceramic substrate. Glass substrates include, for example, silicate glass, aluminosilicate glass, boroaluminosilicate glass, germanate glass and various glass-ceramics (i.e., glasses which contain at least 5% crystal phase). Plastic substrates are preferably flexible or bendable, and include, for example, polyimide, PTFE and various other polymer based materials. Ceramic substrates include, for example, sapphire, alumina, zirconia, yttria stabilized zirconia and quartz (crystalline silica), etc. It should be noted that it is possible to form a single crystal silicon layer directly on a sapphire substrate.

The silicon layer 5 formed on the insulating substrate 8 may be a single crystal silicon layer formed by the wafer bonding method. This method includes providing a temporary monocrystalline silicon substrate (not shown) and forming the at least one driver circuit 2 in this substrate. The temporary substrate is then selectively removed from below the driver circuit 2, such that only the single crystal silicon layer 5 in which the driver circuit 2 is located remains. The temporary substrate may be removed by selective wet etching which preferentially etches the first conductivity type substrate to the second conductivity type layer 5 in which the driver circuit 2 is located. Alternatively, the temporary substrate may be removed by non-selective etch back or chemical mechanical polishing which is stopped before any portion of the driver circuit is removed, by using an etch stop layer and/or a timed etchback or polishing. After the temporary substrate is removed, a permanent insulating substrate 8 (such as a glass substrate) is attached to the at least one driver circuit 2.

Alternatively, the silicon layer 5 may be a polycrystalline or an amorphous silicon layer formed directly over an insulating substrate 8. If desired, an optional impurity blocking insulating layer, such as a silicon oxide, silicon nitride or aluminum oxide layer may be formed between the insulating substrate 8 and the silicon layer 5. If desired, the crystallinity of the layer 5 may be improved by laser and/or thermal annealing. Thus, for example, an amorphous silicon layer may be converted into a polycrystalline silicon layer. If desired, a crystallization catalyst material, such as Ni, Ge, Pt, Pd, etc., may be used as a seed for the crystallization of the amorphous silicon layer.

In an alternative aspect of the first preferred embodiment, at least a part, and preferably all of the at least one driver circuit 2 is formed within the memory array or above the memory array. Thus, the driver circuit 2 is also formed in an SOI substrate, which comprises an amorphous or polycrystalline semiconductor (i.e., silicon) layer(s) which is separated from a monocrystalline semiconductor or insulating substrate by one or more interlayer insulating layers and/or one or more device levels of the memory array. In this aspect of the first embodiment, the at least one driver circuit is vertically integrated with the memory array to increase the device density.

Figure 3:
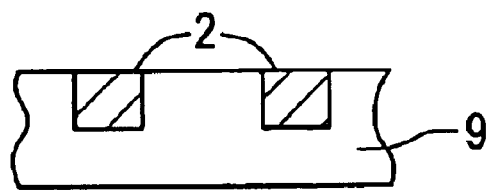

In a second preferred embodiment of the present invention, the at least one driver circuit 2 is formed in a III-V, II-VI or IV—IV semiconductor substrate 9, as shown in FIG. 3. The array of nonvolatile memory devices (not shown in FIG. 3) is formed above or adjacent to the at least one driver circuit 2. For example, the III-V semiconductor substrate may be a GaAs, InP or GaN substrate. The II-VI semiconductor substrate may be a ZnSe, CdSe or CdS substrate. The IV—IV substrate may be a silicon carbide ("SiC") or a SiGe substrate.

In the arrays of the first and second embodiments, the at least one driver circuit 2 may include a decoding circuit, a sensing circuit, a programming circuit and/or other logic circuits. The array of nonvolatile memory devices 4 comprises an array of PROMs, EPROMs or EEPROMs. The array 4 may be a two or a three dimensional array. Preferably, the array of nonvolatile memory devices comprises a monolithic three dimensional array of memory devices. The term "monolithic" means that layers of each level of the array were directly deposited on the layers of each underlying level of the array. Thus, a first interlayer insulating layer is formed over the at least one driver circuit, at least one first semiconductor layer is deposited over the first interlayer insulating layer, and a first array of PROMs, EPROMs or EEPROMs is formed in the at least one first semiconductor layer. Then, a second interlayer insulating layer is formed over the first array of PROMs, EPROMs or EEPROMs. At least one second semiconductor layer is formed over the second interlayer insulating layer. A second array of PROMs, EPROMs or EEPROMs is formed in the at least one second semiconductor layer to form a monolithic three dimensional array. Additional array levels may be formed in the same fashion if desired. In contrast, two dimensional arrays may be formed separately and then packaged together to form a non-monolithic memory device.

The various nonvolatile memory devices which may be formed in the array of memory devices 4 are described below with respect to the third through seventh preferred embodiments. It should be noted that memory devices other than those described below may formed in the array instead. For example, the memory devices may comprise the devices disclosed in U.S. Pat. Nos. 5,825,046, 6,075,719, 6,087,674 and 6,141,241, incorporated herein by references.

In a third preferred embodiment of the present invention, the array of nonvolatile memory devices 4 comprises a three dimensional array of antifuses. The array of antifuses preferably comprises a first set of rail stack conductors, a second set of rail stack conductors extending in a different direction than the first set of rail stack conductors, and an insulating layer disposed between the first and the second sets of rail stacks, as illustrated in FIG. 4.

Figure 4A:
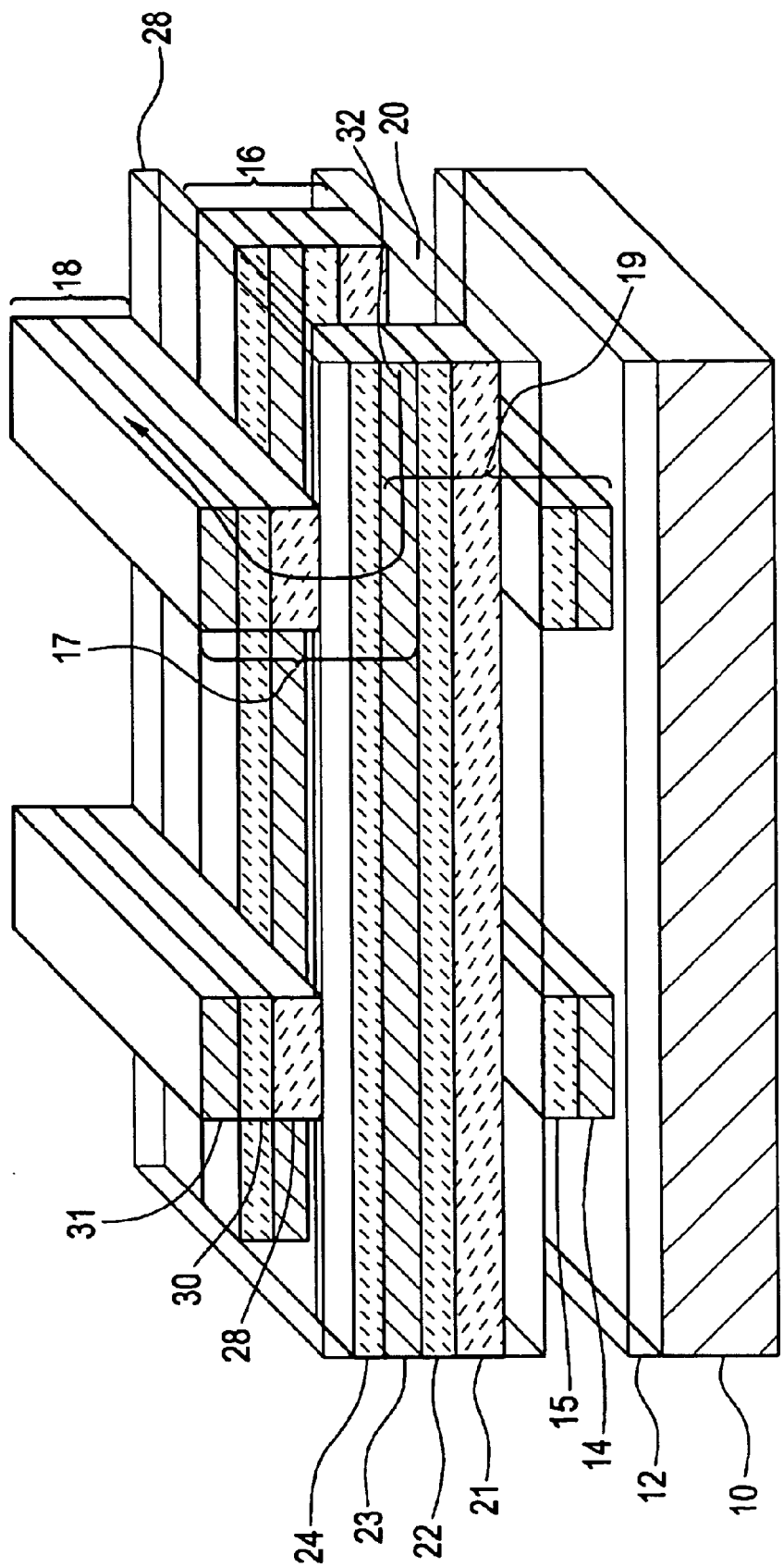
FIG. 4A is a three dimensional view of a rail stack antifuse memory array according to the third preferred embodiment of the invention.

The array of FIG. 4A may have any number of levels of memory cells, such as 2 to 8 levels. Each level includes a first plurality of parallel spaced-apart rail-stacks running in a first direction and a second plurality of rail-stacks or conductors running in a second direction. Preferably, the first rail-stacks run perpendicular to the second conductors/rail-stacks and hence form a right angle at their intersections.

A bit can be stored at each of the intersections of rail-stacks. However, there are no physically discrete individual memory cells at the intersections, rather memory cells are defined by the rail-stacks and intermediate layers. This makes it easier to fabricate the memory array. The term "memory cell" is intended broadly to encompass physically discrete elements or elements that are defined by rail-stacks and intermediate layers, or any other localized region where a bit can be stored. When the array is fabricated all the bits are in the zero (or one) state and after programming, the programmed bits are in the one (or zero) state.

In the embodiment of FIG. 4A, several rail-stacks are illustrated in the partial cross-section of the array. For instance, a rail-stack 16 is shown at one height and a half rail-stack 18 is shown at a second height above the first height. Also, half rail-stacks are disposed between rail-stack 16 and a substrate 10.

These lower rail-stacks run in the same direction as the half rail-stack 18. A bit is stored at the intersection of rail-stacks and, for instance, a "cell" is present between the rail-stacks as shown within the bracket 17 and another within the bracket 19. Each of these brackets spans a memory level.

The substrate 10 may comprise an SOI substrate of the first embodiment or a compound semiconductor substrate of the second embodiment. The at least one driver circuit 2 is fabricated in substrate 10 under the memory array 4 using, for instance, ordinary MOS and CMOS fabrication techniques. Vias are used to connect conductors within the rail-stacks to the substrate to allow access to each rail-stack in order to program data into the array and to read data from the array. For instance, the circuitry within the substrate 10 may select the rail-stack 16 and the rail stack 18 to program or to read a bit associated with the intersection of these rail-stacks. Alternatively, the at least one driver circuit 2 may be formed within or above the memory array, if desired.

As shown in FIG. 4A, an insulating layer 12 is formed over the substrate 10 containing the driver circuit(s) in order that the array may be fabricated above the substrate. This layer may be planarized with, for instance, chemical-mechanical polishing (CMP) to provide a flat surface upon which the array may be fabricated.

Following this, a conductive layer 14 is formed over the substrate. As will be seen, conductive layers are used within the rail-stacks and these layers and the resultant conductors may be fabricated from elemental metals such as tungsten, tantalum, aluminum, copper or metal alloys such as MoW. Metal silicides may also be used such as $TiSi_2$, $CoSi_2$ or a conductive compound such as TiN, WC may be used. A highly doped semiconductor layer such as silicon is also suitable. Multiple layer structures may be used selecting one or more of the above.

Following the deposition of a conductive layer, a layer of semiconductor material 15, such as silicon, is formed over the conductive layer. This is typically a polysilicon layer; however, an amorphous layer may be used. Other semiconductor materials may be used such as Ge, GaAs, etc. In the embodiment of FIG. 4A, this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in the next level.

Following this, in the embodiment of FIG. 4A, a material for the antifuses used to program the array is deposited. In one embodiment, the layer 20 is a dielectric such as silicon dioxide which is deposited by chemical vapor deposition (CVD) in a blanket deposition over the half rail-stacks and filling the space between the rail-stacks to form a dielectric fill. Preferably, the fill insulating material, such as silicon oxide, is blanket deposited to fill in the spaces between the rail stacks which include layers 14 and 15. The fill material is then planarized to expose the top surface of the semiconductor layer 15 in the rail stacks, and the antifuse layer 20, such as silicon oxide, is deposited over the rail stacks and the fill material. In another alternative aspect of this embodiment, the layer 20 is selectively grown on the upper surface of the silicon layer 15 and only exists on the rail-stacks.

Now a full set of memory array rail-stacks is formed on the layer 20. This comprises first the deposition of a lightly doped silicon layer 21 doped with a conductivity-type dopant opposite to that used for the silicon layer 15, a heavily doped silicon layer 22 doped also opposite to the layer 15, a conductive layer 23 and a heavily doped silicon layer 24 doped with the same conductivity-type dopant as layers 21 and 22. After masking and etching, the rail-stacks shown in FIG. 4A, such as rail-stack 16, are formed. These rail-stacks are oriented, as illustrated, in a direction perpendicular to the rail-stacks above and below them.

While not shown in FIG. 4A, the spaces between the rail-stacks are filled with a dielectric such as silicon dioxide. Then the rail-stacks and fill are planarized by chemical mechanical polishing (CMP). In another embodiment spin-on-glass (SOG) is used to fill the voids. In this case chemical planarization (i.e., etch back) can be used. Other fill and planarization methods can be used.

After formation of the rail-stacks another antifuse layer 26 is formed, for instance from a dielectric such as silicon dioxide, silicon nitride, silicon oxynitride, amorphous carbon or other insulating materials or combinations of materials. Also an updoped layer of silicon may be used for the antifuse layer.

Now another layer of rail-stacks is defined and only half rail-stacks are shown in FIG. 4A at this upper level. This half rail-stack comprises a silicon layer 28 doped with a conductivity-type dopant opposite to that of layer 24. This is a lightly doped layer. Another silicon layer 30 is formed on layer 28 and this layer is doped with the same conductivity-type dopant as layer 28; however, it is more heavily doped.

Then a conductive layer 31 is formed above the layer 30.

Half rail-stacks are used at the very upper-most level of the array and at the very lowest level of the array. In between the half rail-stacks, full rail-stacks, such as rail-stack 16, are used throughout the array.

It should be noted that the silicon layers disposed on the conductive layers extend the entire length of the rail-stacks in the embodiment of FIG. 4A and are uninterrupted, except possibly where vias are used to provide a conductive path to the substrate 10.

In FIG. 4A a path 32 is illustrated from a lower conductor in level 17 to an upper conductor in this level found in the rail-stack 18. This path is accessed in one embodiment through decoding circuitry in the substrate for both programming and reading of data into and from the array for one bit.

For instance, to program the bit, a relatively high voltage, e.g. 5–20V, is applied between the conductors to forward-bias the diode between these conductors. This relatively high voltage causes a breach in the layer 26 creating a diode. Without this high voltage, the layer 26 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than the programming voltage is used. This lower voltage is applied so as to forward-bias the diode of the cell being accessed and thus allow a sense amplifier to determine whether or not the layer 26 is intact between the rail-stacks. Note that "sneak" or parasitic paths in the array which would interfere with the sensing will include a reverse-biased diode.

Also, the anode and cathode of the diodes are reversed at each of the successive antifuse layers. This facilitates programming and sensing, since all of the conductors at each level are either bitlines or wordlines. And, for instance, conductors at one height will serve as bitlines for two levels and conductors at the next height serve as wordlines for two levels. This simplifies the decoding and sensing and more importantly reduces processing.

Figure 4B:
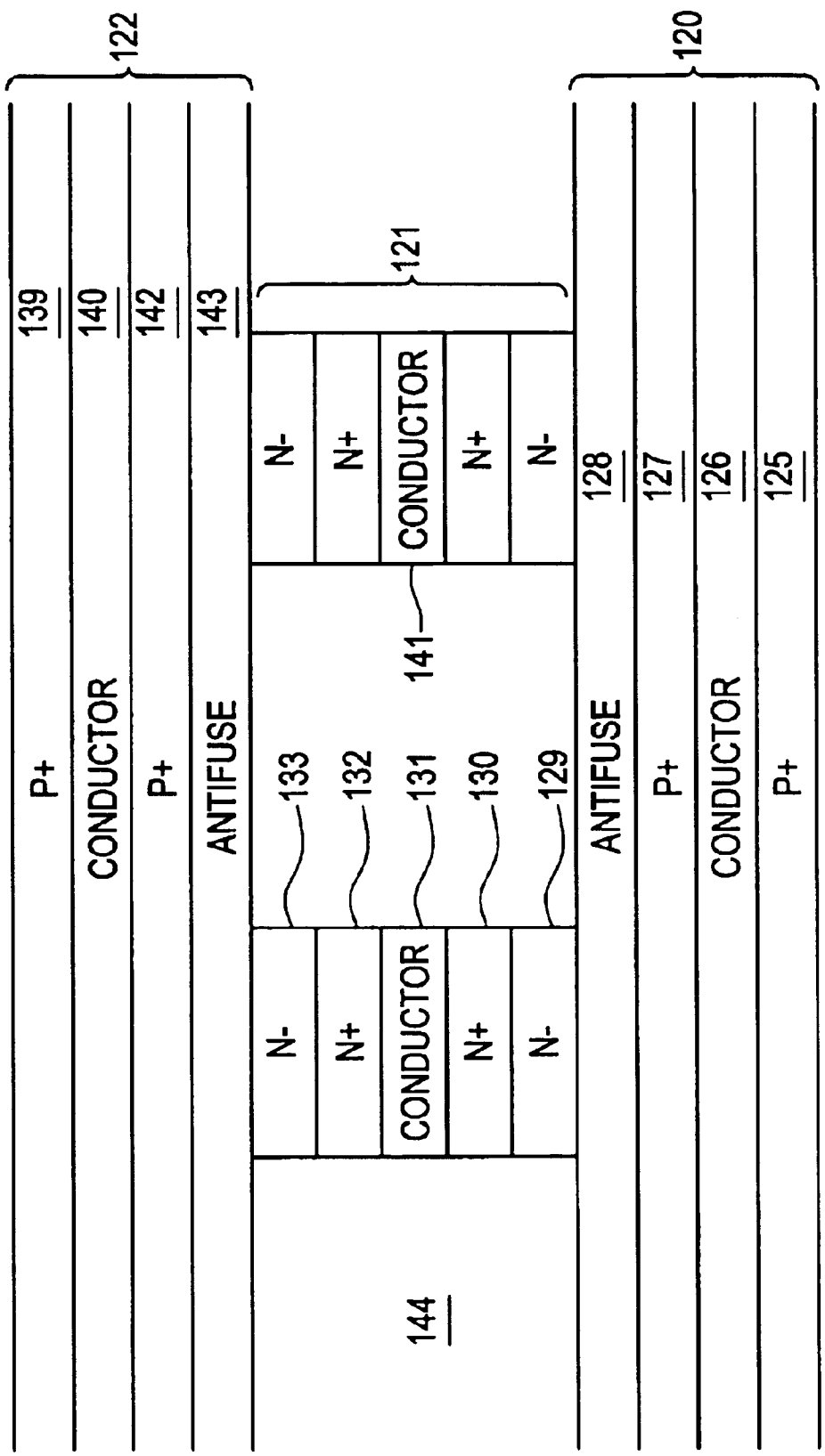
FIG. 4B is a side cross sectional view of a rail stack antifuse memory array according to an alternative aspect of the third preferred embodiment of the invention.

Some diode types may exhibit a higher leakage current than other diode types. Consequently, it may be desirable to form an array with only a single diode type. Specifically, the P−/N+ diodes have a higher leakage current than P+/N− diodes. FIG. 4B illustrates an array of a preferred aspect of the third embodiment where, if the antifuse layer is breached, all the diodes will have a P+/N− junction. Thus, there will be no diodes with a P−/N+ junction.

In FIG. 4B, three rail-stacks 120, 121, and 122 are illustrated which will create a P+/N− diodes when an antifuse layer is breached. The first rail-stack 120 comprises a first P+ semiconductor (i.e., silicon) layer 125, a conductor 126, a second P+ layer 127 and an antifuse layer 128. The thickness of layers 125–127 may be 400 to 3000 Å, such as 1,000/500/1,000 Å, for layers 125, 126 and 127 respectively. The antifuse layer 128 may be about 20–40 Å, preferably about 30 Å thick.

The second rail-stack 121 comprises a first N− semiconductor (i.e., silicon) layer 129, a first N+ semiconductor layer 130, a conductor 131, a second N+ layer 132 and a second N− layer 133. The thickness of layers 129–133 may be 400 to 3000 Å, such as 2,000/500/500/500/2000 Å for layers 129, 130, 131, 132 and 133 respectively.

The third rail-stack 122 contains the same layers as the first rail-stack 120 in reverse order. The third rail stack includes a first P+ semiconductor (i.e., silicon) layer 139, a conductor 140, a second P+ layer 142 and an antifuse layer 143.

As discussed above, the semiconductor layers may comprise polysilicon or amorphous silicon. The conductors may be heavily doped polysilicon, metal, silicide or combinations thereof. A CMP planarized dielectric fill 144, such as silicon dioxide, is provided in the spaces between the rail-stacks.

As can be seen from FIG. 4B, if the antifuse layer 128 is breached, the diodes between the conductors 126 and 131 are all P+/N− type. Similarly, the diodes in the next level between the conductors 131 and 140 are again all P+/N− type. The rail-stacks shown are used throughout the memory array so that the entire array has only P+/N− type diodes in its memory cells.

The diodes in the illustrated rail-stacks of FIG. 4B are forward biased towards the conductor 131 and the conductor 141. If need be for a particular application, the diodes can be oriented identically, that is, with all their anodes (or cathodes) pointing upwardly. This can be obtained for the P+/N− type diodes by having both a P+ doped and N− doped semiconductor layer in each of the rail-stacks. For instance, layers 132 and 133 would be replaced with a P+ layer and layer 142 would be replaced with N− and N+ layers. This still maintains only one type of diode (P+/N−) throughout the array.

While FIG. 4B shows that after the antifuse layer is breached, only P+/N− diodes will be created, an array with only P−/N+ type diodes can be fabricated by replacing the P+ layers with N+ layers and replacing the N+ and N− layers with P+ and P− layers, respectively. Also, the array can have the anodes (or cathodes) vertically aligned as discussed above for the P+/N− type diodes.

According to the fourth preferred embodiment of the present invention, the array of non-volatile memory devices comprises a three dimensional array of rail stack EEPROMs. These EEPROMs are three terminal devices in contrast to the two terminal antifuse devices of the third embodiment. The array comprises a first plurality of spaced-apart conductors disposed at a first height above the substrate in a first direction. The array also comprises a second plurality of spaced-apart rail-stacks disposed above the first height in a second direction different from the first direction, each rail-stack including a semiconductor film of a first conductivity type in contact with said first plurality of spaced-apart conductors, a local charge storage film disposed above the semiconductor film and a conductive film disposed above the local charge storage film.

Figure 5:
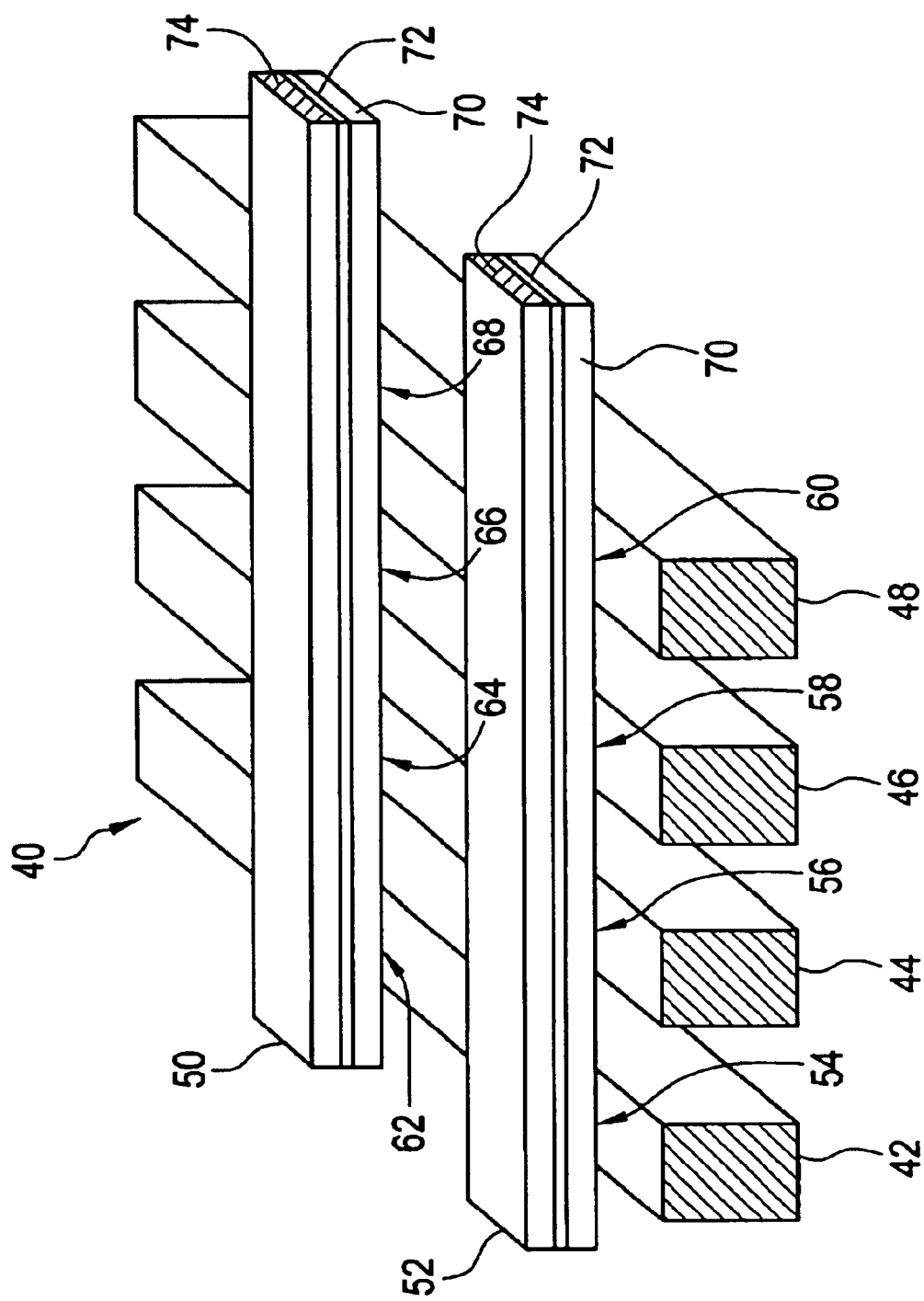
FIG. 5 is a three dimensional view of a rail stack EEPROM memory array according to the fourth preferred embodiment of the invention.

FIG. 5 illustrates a three dimensional array of rail stack EEPROMs according to the fourth preferred embodiment of the present invention. The array 40 includes a first plurality of spaced-apart conductors such as n+ doped polysilicon bit lines 42, 44, 46, 48 disposed in a first direction above the substrate (not shown). A second plurality of spaced-apart "rail stacks" 50, 52 are disposed in a second direction different from the first direction (and preferably orthogonally) at a second height above the substrate so that they are above bit lines 42, 44, 46 and 48 and in contact therewith at intersection points 54, 56, 58, 60, 62, 64, 66, 68. Each rail stack 50, 52 in this embodiment includes at least a layer of p− doped polysilicon 70. Over layer 70 is disposed a charge storage medium 72, such as a dielectric isolated floating gate, an ONO dielectric film (i.e., a $SiO_2/Si_3N_{4-x}O_{1.5x}/SiO_2$ film, where $0 \leq x \leq 1$) or an insulating layer containing conductive nanocrystals. A conductive wordline 74 which may comprise n+ doped polysilicon is disposed over the charge storage medium 72. A planarized oxide material (not shown) may be deposited in the spaces between adjacent bit lines and rail stacks. A conventional chemical mechanical polishing (CMP) process may be used to accomplish this. If desired, the bit lines 42, 44, 46, 48 may comprise p+ doped rather than n+ doped polysilicon, while layer 70 may comprise n− doped rather than p− doped polysilicon.

The memory array structure of FIG. 5 can be easily extrapolated to three dimensions. To do this, an interlayer insulating layer is placed over the rail stacks 50, 52 after the CMP process. This layer prevents shorting one set of wordlines with the next set of bit lines. Then another layer of bit lines 42, 44, 46, 48 is constructed over the interlayer insulating layer followed by an oxide deposition and a CMP step, followed by a deposition of another set of rail stacks. This process can be repeated a number of times, as desired, to form two or more device levels (such as eight levels, for example).

Figure 6:
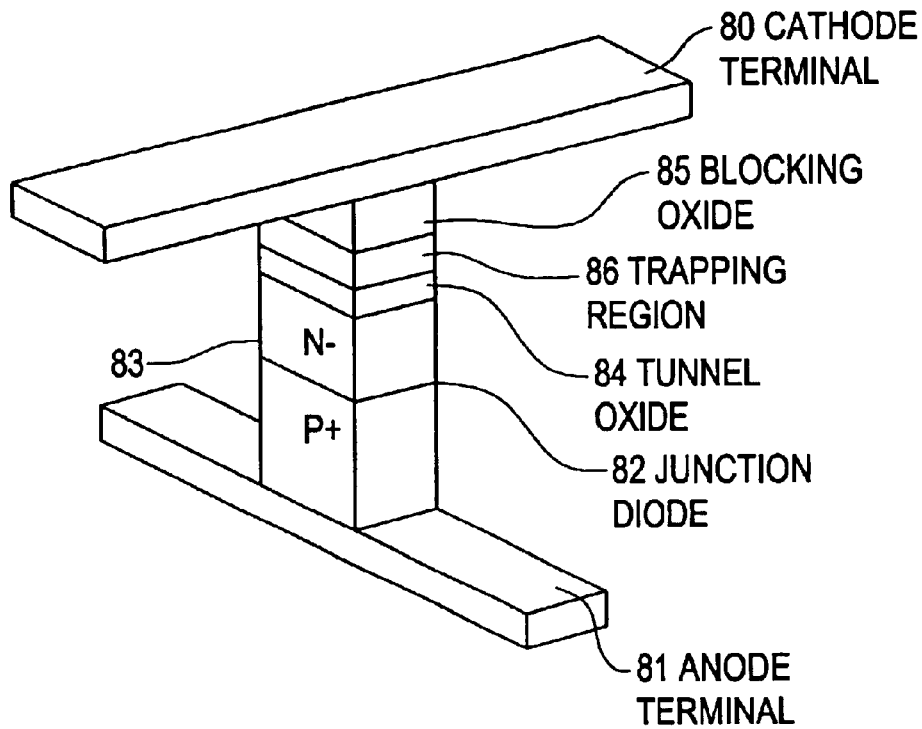
FIGS. 6 and 7 are three dimensional views of two terminal pillar devices according to the fifth preferred embodiment of the invention.

According to the fifth preferred embodiment of the present invention, the array of non-volatile memory devices 4 comprises a three dimensional array of two terminal pillar memory devices. Referring to FIG. 6, one device of the three-dimensional memory is illustrated. The device includes a conductor 81 at one level and a conductor 80 at the next level in the array. A pillar structure is formed in alignment with the conductors 80 and 81. This pillar structure forms a cell in accordance with the present embodiment. Specifically, referring to FIG. 6, the cell includes a steering element and a storage stack. The steering element comprises a junction diode which contains a p+ region 82 and an n− region 10. The storage stack comprises a tunnel oxide region 84, a charge trapping region 86 and a blocking oxide 85. The charge trapping region 86 may comprise silicon nitride, silicon oxynitride, an ONO dielectric film or silicon nanocrystals in an insulating layer. The conductors 80 and 81 are shared with cells disposed above and below the single cell shown in FIG. 6.

Figure 7:
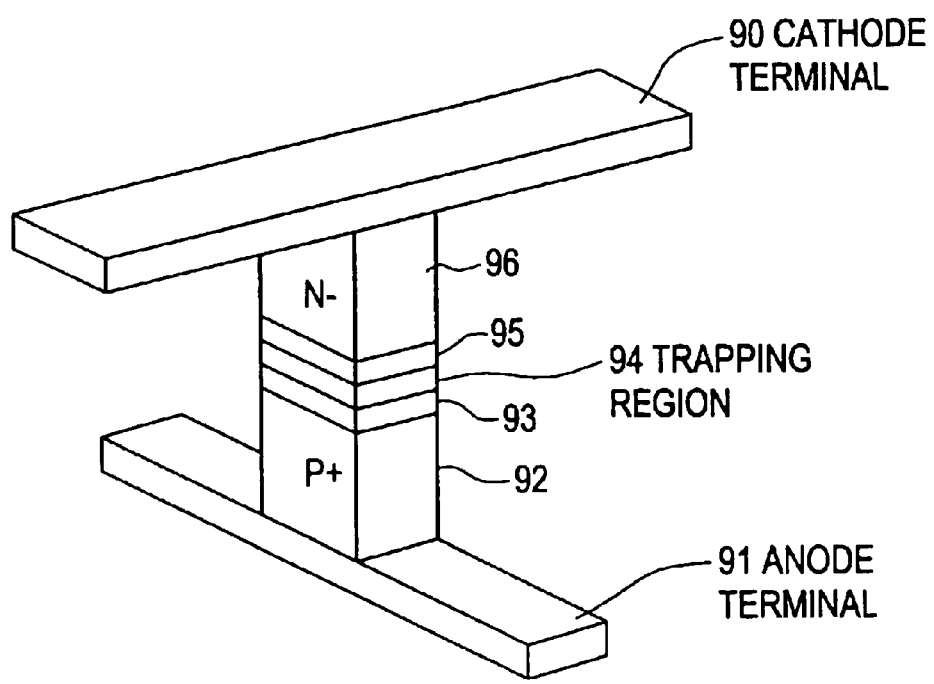

FIG. 7 shows another preferred aspect of this embodiment where again there are spaced-apart, parallel conductors at one level, such as conductor 91, and parallel, spaced-apart conductors at the next level, such as conductor 90. A pillar structure is again fabricated between the conductors 90 and 91. The difference, however, between the structure of FIG. 6 and FIG. 7, is that the storage stack comprising the blocking oxide 93, charge trapping region 94 and tunnel oxide 95 is disposed between the p and n regions of the diode. Specifically, the p+ region 92 of the diode is in contact with the blocking oxide 93 and the n− region 96 is in contact with the tunnel oxide 95.

Figure 8:
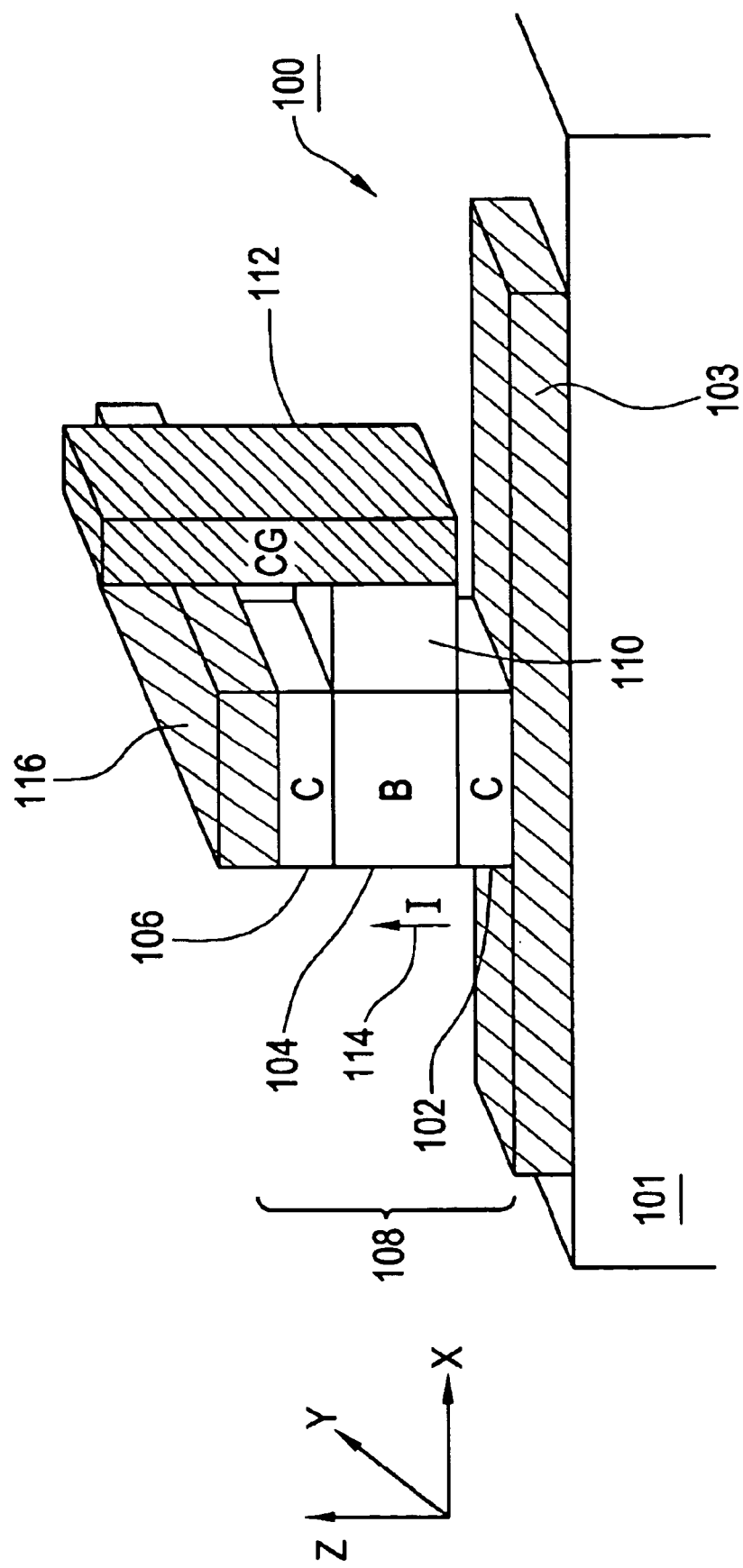
FIG. 8 is a three dimensional view of an EEPROM pillar device according to the sixth preferred embodiment of the invention.

According to the sixth preferred embodiment of the present invention, the array of non-volatile memory devices 4 comprises a three dimensional array of three terminal pillar memory devices, such as pillar EEPROMs. These devices differ from the devices of the previous embodiment in that they contain three rather than two terminals. A three terminal nonvolatile stackable pillar memory device 100 is illustrated in FIG. 8. Pillar memory device 100 includes a first contact region 102 formed on a first input/output (I/O) 103 conductor (i.e., electrode), which is formed above a plane (x-y) of a substrate 101. A semiconductor body 104 is formed directly on the first contact region 102 and a second contact region 106 is formed directly on the body 104. Preferably, the contact regions 102 and 104 are heavily doped semiconductor regions of a first conductivity type (i.e., source and drain regions), while the body is a lightly doped semiconductor region of a second conductivity type (i.e., a channel). The semiconductor regions 102, 104 and 106 preferably comprise doped polysilicon. A second I/O conductor 116 (i.e., electrode) is formed on the second contact region 106. The first contact region 102, the body 104, and the second contact region 106 are each vertically aligned with one another to form a pillar 108.

Adjacent to and in contact with body 104 is a charge storage medium or region 110. A control gate 112 is formed adjacent to and in direct contact with the charge storage medium or region 110. The control gate 112 and charge storage medium 110 are constructed so that they lie laterally adjacent to pillar 108 so that they may electrically communicate with the pillar 108. The charge storage medium is the region that electrically screens the control gate and the channel region addressed by the control gate. The charge storage medium may comprise a silicon oxide/nitride/oxide ("ONO") dielectric film, conductive nanocrystals in an insulating layer or a floating gate located between a tunnel dielectric layer and a control gate dielectric layer.

During read operations of device 100, when a conductive channel is formed in body 104, current 114 flows vertically (z) (or perpendicular) with respect to the plane (x-y) of the substrate 101 above which pillar memory device is formed. By creating a memory device with a "vertical" read current path, the pillar memory cell of the present embodiment can be easily stacked in a three dimensional array with source/drain conductors 103 and 116 running parallel or perpendicular to each other and parallel to the plane of the substrate 101 without requiring the use of vertical interconnect strategies for the source and drain connections. The conductor 112 to the control gate may be run vertically (as shown in FIG. 8) or horizontally.

Although memory device 100 shown in FIG. 8 includes a charge storage medium 110 and a control gate 112 formed on only one side or surface of pillar 108, it is to be appreciated that the pillar memory device of the present embodiment can be fabricated so that the entire body of the pillar 108 is surrounded by a single charge storage member 110 and a single control gate 112. Additionally, each surface of the pillar 108 can have an independently controlled charge storage member and control gate and thereby enable multiple bits of data to be stored in a single pillar memory device. The use of multiple charge storage members and control gates enables the storage of multiple values on a single pillar device by determining how much of the channel is exposed to charge. Additionally, each face of body 104 of pillar 108 can have different doping densities to create different threshold voltages for each face to further enable the pillar memory to store additional states and therefore additional bits.

According to the seventh preferred embodiment of the present invention, the array of non-volatile memory devices 4 comprises a three dimensional array of thin film transistor ("TFT") EEPROMs. This array comprises a plurality of vertically separated device levels, each level comprising an array of TFT EEPROMs. Each TFT EEPROM includes a channel, source and drain regions, a control gate, and a charge storage region between the channel and the control gate. The array also comprises a plurality of bit line columns in each device level, each bit line contacting the source or the drain regions of the TFT EEPROMs. The array further comprises a plurality of word line rows in each device level, and at least one interlayer insulating layer located between the device levels.

Figure 9:
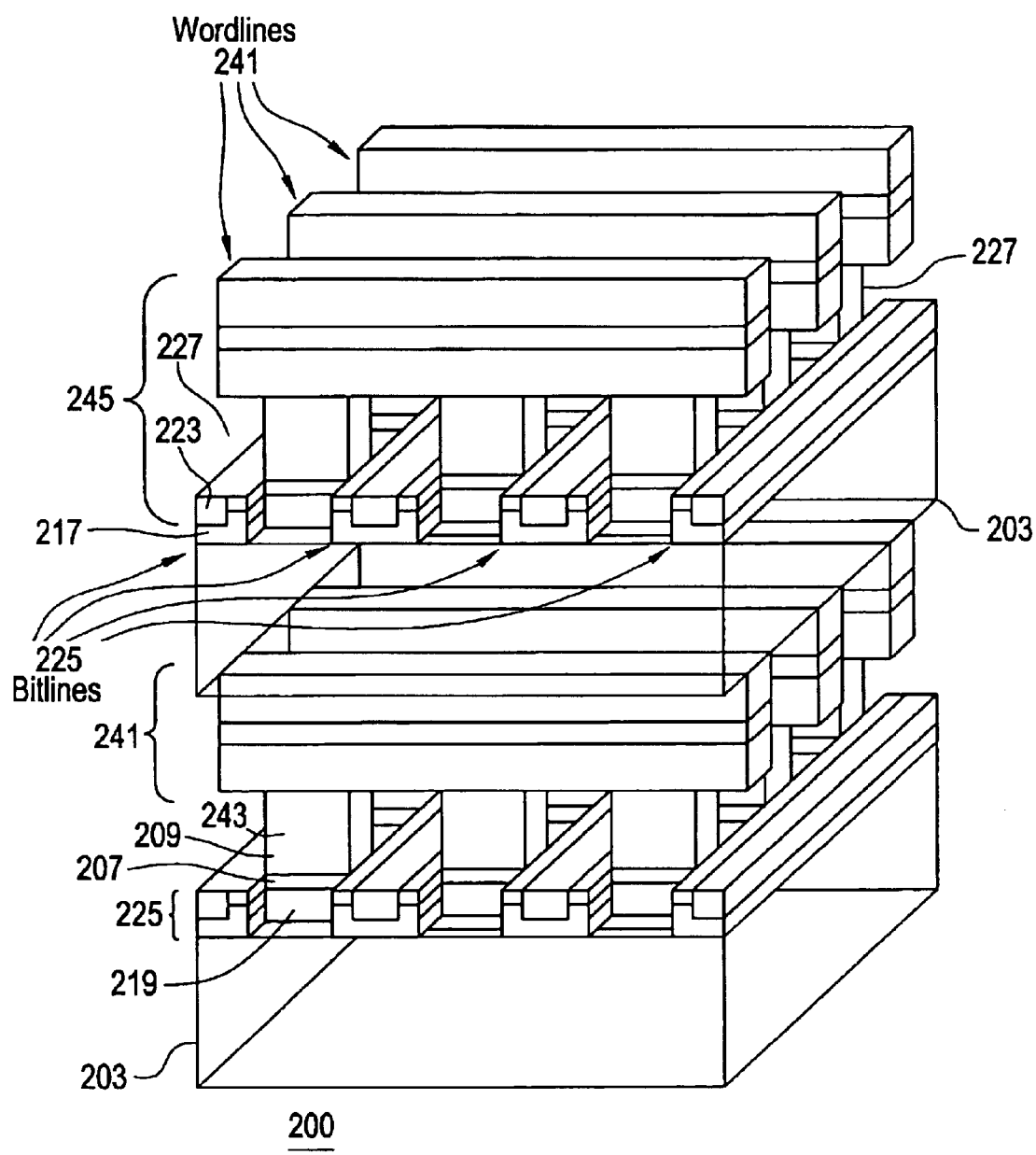
FIG. 9 is a three dimensional view of an TFT EEPROM array according to the seventh preferred embodiment of the invention.

FIG. 9 illustrates a preferred three dimensional memory array 200 according to the seventh preferred embodiment of the present invention. The three dimensional memory array 200 is a three dimensional array of TFT EEPROMs. Each TFT EEPROM contains source and drain regions 217, a channel 219, a control gate 243, control gate sidewall spacers (not shown for clarity in FIG. 9) and a charge storage region 207 between the channel and the control gate. The channel 219 of each TFT EEPROM comprises amorphous silicon or polysilicon. The charge storage region 207 may comprise a silicon oxide/nitride/oxide ("ONO") dielectric film, isolated nanocrystals or a floating gate located between a tunneling dielectric and a control gate dielectric layer.

The memory array 200 also contains a plurality of bit line columns 225. Each bit line 225 contacts the source or the drain regions 217 of a plurality of TFT EEPROMs. The columns of the bit lines 225 extend substantially perpendicular to the source-channel-drain direction of the TFT EEPROMs (i.e., a small deviation from the perpendicular direction is included in the term "substantially perpendicular"). The bit lines 225 in each device level are shaped as rails which extend under the intergate insulating layer 227. The bit lines include the buried diffusion regions formed during the source and drain 217 doping steps and the overlying silicide 223 layers. The source and drain regions 217 are formed in the bit lines 225 where the word lines 241 intersect (i.e., overly) the bit lines 225. The doped source and drain regions 217 are located adjacent to the TFT EEPROM channel regions 219.

The memory array 200 also includes a plurality of word line rows 241. Each word line 241 contacts the control gates 243 of a plurality of TFT EEPROMs 200. Alternatively, the word lines can themselves comprise the control gates. The rows of word lines extend substantially parallel to the source-channel-drain direction of the TFT EEPROMs. The plurality of word lines 241 are self aligned to the control gates 243 of the array of TFT EEPROMs or the word lines themselves comprise the control gates. If floating gates, but not control gates are included in the array, then the word lines are self aligned to the floating gates and to the control gate dielectric. The word lines are also self aligned to the channel and the charge storage regions of the TFT EEPROMs located below the respective word lines.

Each device level 245 of the array is separated and decoupled in the vertical direction by an interlayer insulating layer 203. The interlayer insulating layer 203 also isolates adjacent word lines 241 and adjacent portions of the channels 219 below the respective word lines 241 in each device level 245. The effective cell area per bit in the resulting three dimensional memory array is about $2f^2/N$, where N is number of device levels (i.e., N=1 for a two dimensional array and N>1 for a three dimensional array).

Each level of the TFT EEPROMs may be formed by forming a plurality of gate electrodes 209 on the active silicon areas. The source and drain regions 217 are implanted into the active silicon areas using the gates 209 as a mask. The remaining silicon active areas form the TFT channel regions 219. Sidewall spacers (not shown) are formed on the gates 209. Then, silicide regions 223 are formed on the source and drain regions 217 by the salicide method. The intergate insulating layer 227 is deposited over the gates 209 and planarized to expose the gates 209. If desired, a sacrificial blocking layer may also be formed over the gates 209. The blocking layer is removed after layer 227 is planarized to expose the gates 209. Then a conductive material is deposited and patterned to form the word lines 241 and control gates 243. The channels 219 and the charge storage region 207 are also patterned during the same etching step using the same photoresist mask.

The memory devices of the preferred embodiments of the present invention may be arranged in a three dimensional virtual ground array (VGA) nonvolatile flash memory. The devices may also be formed in nonvolatile flash memory architectures other than VGA, such as NOR-type memory and Dual String NOR (DuSNOR) memory architectures.

In a VGA illustrated in the previous embodiments, the programming of each EEPROM occurs by hot carrier injection. In hot carrier injection, a voltage is placed across a diode (i.e., between a source and a drain of a TFT EEPROM). The hot carriers (i.e., hot electrons and holes) that are travelling from source to drain through the channel of the TFT EEPROM are injected into the charge storage region which is disposed adjacent to the channel. This procedure is a relatively high power event.

For low power portable applications where both program/erase and read power are important, a flash nonvolatile memory using Fowler-Nordheim tunneling ("FN tunneling") for both program and erase may be used. FN tunneling results from applying a voltage across a dielectric. Thus, in a TFT EEPROM, a voltage is applied between a control gate and a source and/or a drain region of the TFT, for writing and erasing the TFT EEPROM. This is in contrast with hot carrier injection programming, where a voltage is applied between the source and the drain regions.

A flash memory array which uses FN tunneling for program and erase is advantageous because thousands of bits in such a flash memory array may be programmed at the same time. Also, FN tunneling is a very efficient way of programming since most (close to 100%) of the current goes to program the device. This is in contrast with hot carrier injection where only about 1–2% of the source-drain current goes to program the device.

Thus, in an eighth preferred embodiment of the present invention, charge storage devices, such as TFT EEPROMs, are arranged in a flash memory array configuration which utilizes FN tunneling programming. The TFT EEPROMs may be arranged in the rail stack, pillar or self-aligned TFT or configurations of the previous embodiments. Preferably, the TFT EEPROMs are arranged in the rail stack configuration.

The VGA is not compatible with FN tunneling since the whole channel polysilicon inverts along the length of the pulsed-high word line and will then program cells in addition to the one that needs programming. Therefore, the FN tunneling rail stack (crosspoint) flash array differs from the VGA in that in the FN tunneling array the active polysilicon layer is patterned into polysilicon islands to allow FN tunneling programming. Thus, an extra photolithographic masking step is added to the process of making the rail stack array shown in FIG. 5 during which the polysilicon active layer is etched into islands in each device cell. The same photoresist mask can be used to define (i.e., etch) the charge storage regions in each cell.

Figure 10A:
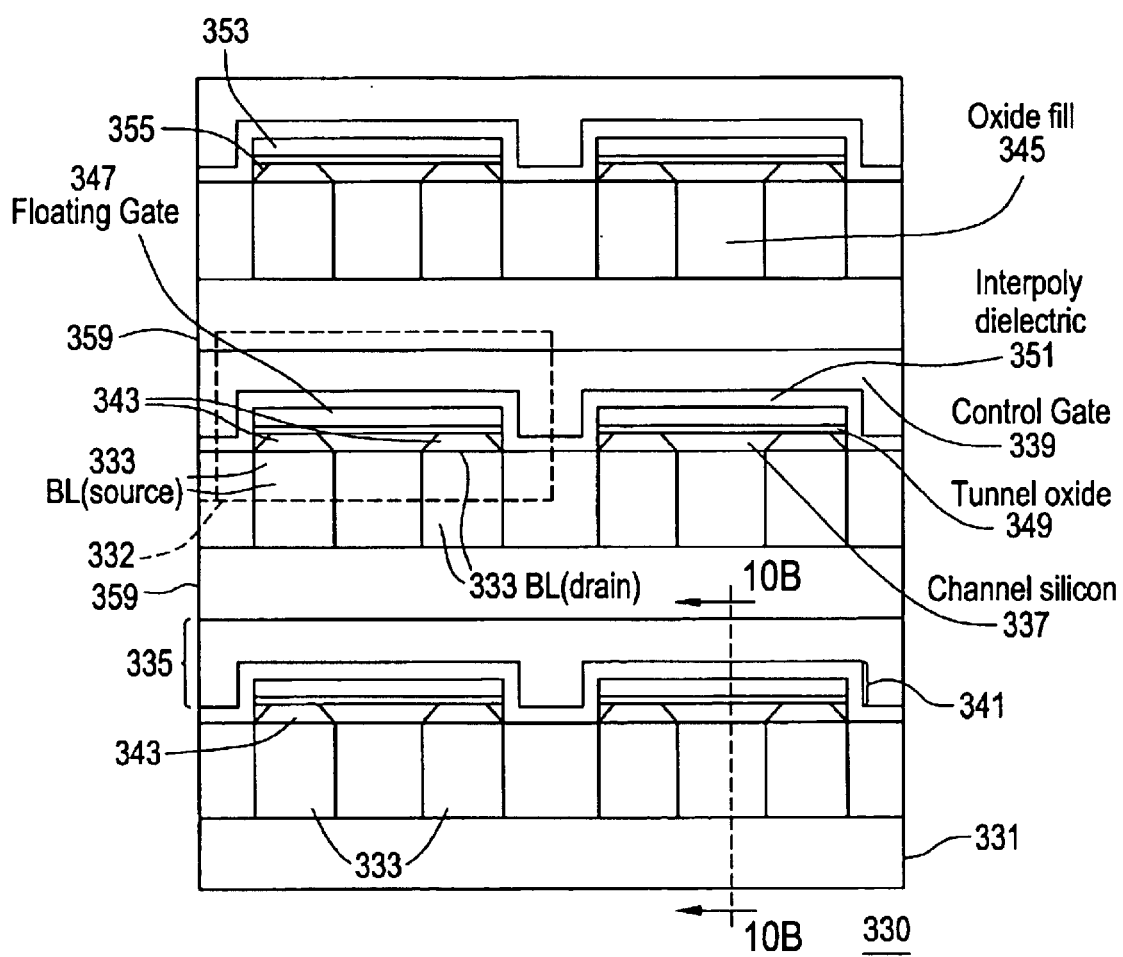
FIG. 10A is side cross sectional view of an FN tunneling flash memory array according to the eighth preferred embodiment of the invention.

In FIG. 10A, the flash memory array 330 is preferably formed over a planarized interlayer insulating layer 331, such as a CMP planarized silicon oxide layer. Layer 331 is formed over a substrate (not shown) as in the previous embodiments. Each device of the array (shown by dashed lines 332 in FIG. 10A) is thus a TFT because it is formed over an insulating layer.

The array 330 contains a first plurality of spaced-apart conductive bit lines 333 disposed at a first height above the substrate in a first direction. The array also contains a second plurality of spaced-apart rail-stacks 335. The rail stacks are disposed at a second height in a second direction different from the first direction. Preferably, the bit lines 333 and the rail stacks 335 are arranged perpendicular to each other. The TFT EEPROM 332 is formed at the intersection of the rail stacks 335 and the bit lines 333.

Each rail-stack 335 includes a plurality of semiconductor islands 337, which comprise the active regions of the TFT EEPROMs 332. One surface of the islands 337 is in contact with the bit lines 333. Each rail stack 335 also includes a conductive word line 339 and a charge storage region 341 disposed between a second surface of the semiconductor islands 337 and the word line 339.

The semiconductor islands 337 preferably comprise polysilicon of a first conductivity type (i.e., P– or N–). However, the islands may comprise amorphous silicon if desired. The polysilicon islands 337 include source and drain regions 343 of a second conductivity type (i.e., N+ or P+). The source and drain regions 343 are located at contacting intersections between the bit line conductors 333 and the rail stacks 335.

The bit lines 333 preferably comprise polysilicon of the second conductivity type (i.e., N+ or P+). The bit lines 333 contact the source and drain regions 343. Preferably, the source and drain regions are formed by outdiffusion of dopants from the bit lines. Furthermore, an optional metal or a metal silicide layer (not shown in FIG. 10A) may be disposed in contact with the bit lines 333 to increase the conductivity of the bit lines. The space between said spaced-apart bit line conductors 333 is filled with a planarized insulating filler material 345, such as silicon oxide.

The charge storage regions 341 may comprise a dielectric isolated floating gate, electrically isolated nanocrystals or an ONO dielectric stack, as in the previous embodiments. An exemplary array having a dielectric isolated floating gate is illustrated in FIGS. 10A and B. Thus, in the example of FIGS. 10A and B, the charge storage region 341 comprises a polysilicon floating gate 347 between a tunnel dielectric 349, such as a silicon oxide layer, and a control gate dielectric 351 (also known as the intergate or interpoly dielectric) made of a material such as silicon oxide or an ONO layer stack.

As shown in FIGS. 10A and B, the lateral sides 353 of the tunnel dielectric 349 and the floating gate 347 are aligned to the lateral sides 355 of the semiconductor islands 337. The control gate dielectric 351 extends between the semiconductor islands 337 and contacts the planarized insulating material 345 between the semiconductor islands 337. If desired, the floating gate 347 may be made from hemispherical grain polysilicon which has a textured surface to maximize the control gate to floating gate coupling. Alternatively, the coupling may be increased by increasing the floating gate height, by forming horns or protrusions in the floating gate, or by roughening the floating gate surface.

The word line 339 comprises a polysilicon layer of a second conductivity type (i.e., N+ or P+) and a metal or a metal silicide layer in contact with the polysilicon layer. The word line 339 acts as a control gate of the TFT EEPROM in locations where it overlies the charge storage regions 341. Thus, formation of a separate control gate for each TFT is not required.

In one preferred aspect of this embodiment, the rail stacks 335 are disposed above the bit lines 333, as shown in FIGS. 10A and B. However, if desired, the rail stacks 335 may be disposed below the bit lines 333 in each device level, (i.e., bottom gate TFT EEPROMs are formed).

Figure 10B:
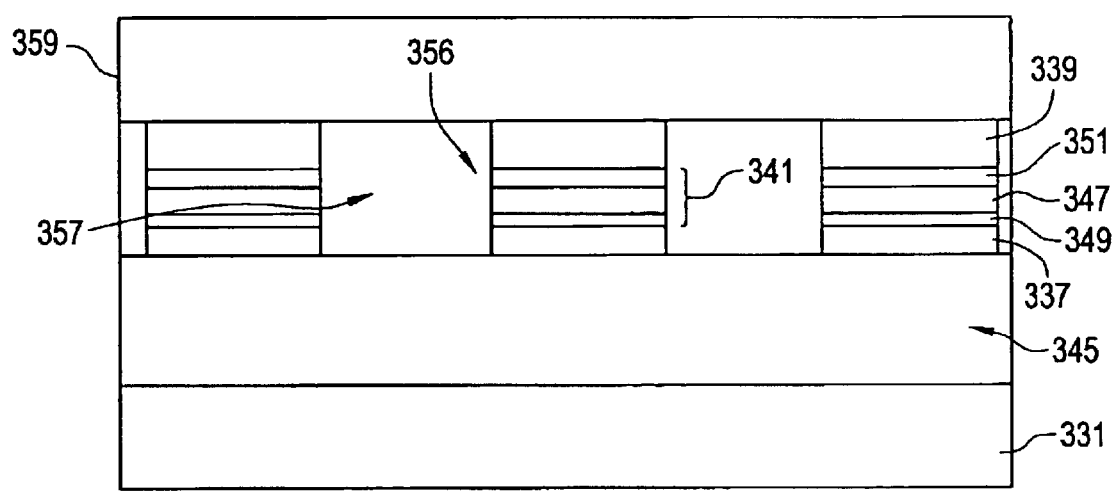
FIG. 10B is a side cross sectional view along line B—B in FIG. 10A.

As shown in FIG. 10B, the word line 339, the charge storage regions 341 and the semiconductor islands 337 (i.e., the rail stacks 335) are aligned in a plane 356 perpendicular to the substrate and parallel to a source to drain direction. The rail stacks 335 are separated by a second planarized insulating layer 357, such as silicon oxide.

While the flash memory array may comprise a two dimensional array, preferably, the flash memory array comprises a monolithic three dimensional array comprising a plurality of device levels. For example, three device levels are shown in FIG. 10A. The device levels are separated by an interlayer insulating layer 359, such as a silicon oxide layer. If desired, layers 357 and 359 may comprise the same silicon oxide layer which is deposited above and between the rail stacks 359, and then planarized by CMP.

To program the selected TFT EEPROM 332, either its drain bit line or its source bit line 333 (or both) are grounded while the positive programming voltage is applied to the selected word line 339 adjacent to the device 332 (which is a high impedance node). All other word lines on the same device level are grounded while all other bit lines on the same level device can float or are placed at a slight positive voltage. This means that only the selected cell 332 experiences the programming voltage across it. Through capacitive coupling, the floating gate 347 is pulled high while the source and/or drain 343 are grounded. Electrons tunnel to the floating gate 347 from the source and/or drain 343 and an inversion channel is formed in the silicon channel 337. The current to program such a cell to get a threshold voltage shift of about 5V in approximately one millisecond is several picoamps.

To erase the cell, the same bit lines 333 can be grounded and a negative voltage pulse is applied to the selected word line 339. All other word lines can either be grounded or can float. All other bit lines float or are placed at a slight negative voltage. A plurality (or all) of EEPROM cells in the array can be erased at the same time by pulsing a plurality of word lines to a high negative value while all bit lines are grounded. Alternatively, the selected wordline is grounded while the selected cell's bit lines are pulsed positive. All other word lines float or are pulsed slightly positive while all the other bitlines are grounded.

The driver circuit(s) 2 may comprise conventional CMOS thin film transistors formed in an SOI substrate or bulk CMOS transistors formed in a compound semiconductor substrate. Alternatively, FIG. 11 illustrates a CMOS TFT array according to a ninth preferred embodiment of the present invention that may be used in a driver circuit 2.

The NMOS and PMOS transistors of the CMOS array may be formed adjacent to each other in the same device level in an alternating fashion (i.e., as alternating NMOS and PMOS transistors). However, in a preferred aspect of the ninth embodiment of the present invention, the one charge carrier type transistors (i.e., NMOS or PMOS) are formed above the other charge carrier type transistors (i.e., PMOS or NMOS) with a common gate line (also known as a word line in memory devices) between them. Thus, the driver circuit 2 of the ninth preferred embodiment comprises a plurality of vertically stacked, common gate CMOS TFT transistors.

Figure 11:
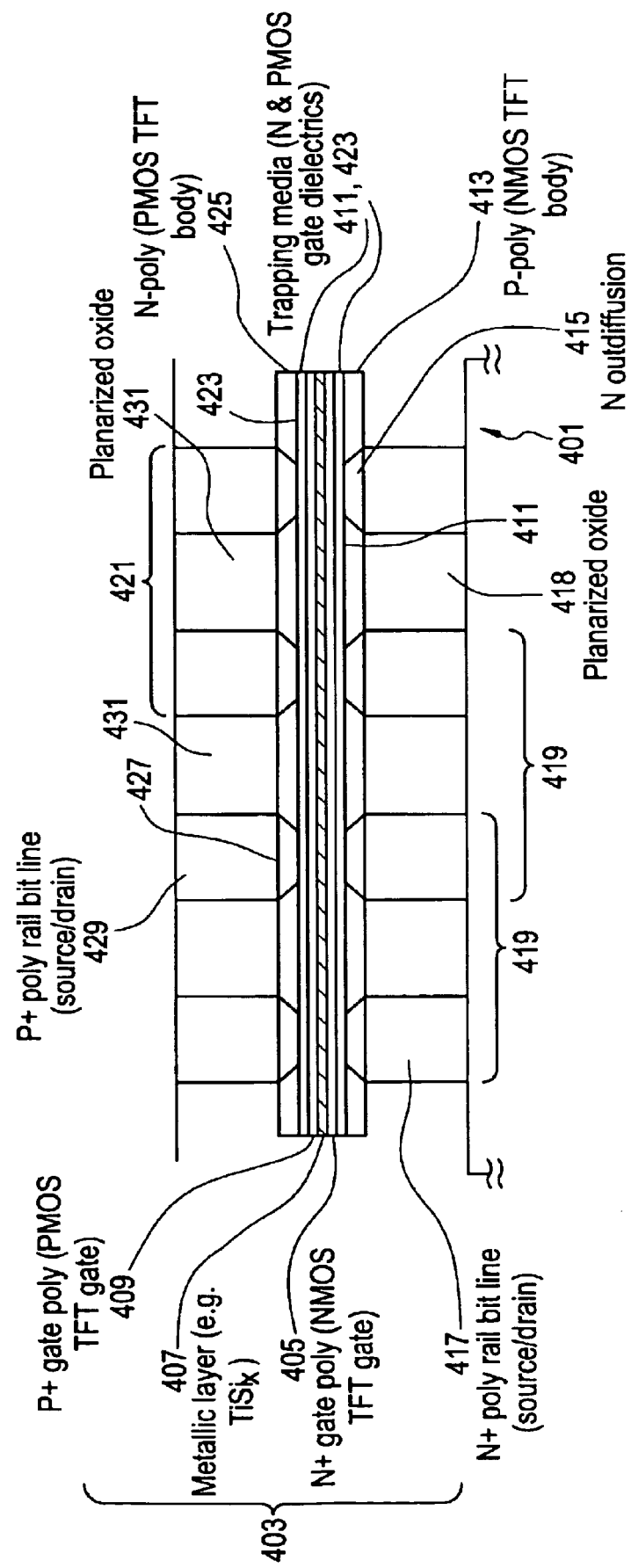
FIG. 11 is a side cross section view of a TFT CMOS EEPROM array according to the ninth preferred embodiment of the invention.

One device level of a vertically stacked, common gate CMOS array in a rail stack configuration according to the ninth preferred embodiment of the present invention is shown in FIG. 11. It should be noted that the array may also be arranged in a pillar or self-aligned TFT configurations illustrated in FIGS. 8 and 9. The CMOS array in FIG. 11 is similar to the array illustrated in FIG. 5, except that transistors of different charge carrier type are formed on either side of the gate line. In FIG. 11, the NMOS transistors are arranged below the PMOS transistors. However, it should be understood that the PMOS transistors may be arranged below the NMOS transistors if desired.

In FIG. 11, the array of CMOS devices 400 is preferably formed over a planarized interlayer insulating layer 401, such as a CMP planarized silicon oxide layer. Layer 401 is formed over a substrate (not shown) as in the previous embodiments. Each CMOS device is thus a CMOS TFT because it is formed over an insulating layer.

The array includes a plurality of gate lines (i.e., word lines) 403 (only one gate line is shown in the cross sectional view of FIG. 11). Preferably the gate line comprises a first N+ polysilicon layer 405, a silicide layer 407, such as a TiSi$_x$ or WSi$_x$ layer, over the first polysilicon layer and a second P+ polysilicon layer 409 above the silicide layer. The gate line 403 acts as a gate electrode in each TFT. Thus, no separate gate electrodes connected to the gate lines are required.

A first insulating layer 411 is disposed adjacent to a first side of the gate electrode 403. This insulating layer 411 may be a conventional gate dielectric. Preferably, the insulating layer 411 is a charge storage layer (i.e., charge trapping media), such as an ONO stack or isolated nanocrystals, to form charge storage CMOS TFTS, such as EEPROM CMOS TFTs. If floating gate type EEPROM CMOS TFTs are desired, then a floating gate and a control gate dielectric may be added between the insulating layer 411 and the gate line 403.

A p-type semiconductor layer 413, such as a P– polysilicon layer, is disposed on a side of the first insulating layer opposite to the gate 403. This layer contains the NMOS TFT bodies. N+ source and drain regions 415 are disposed in layer 413. The portions of layer 413 between regions 415 comprise NMOS TFT channel regions.

Preferably, the source and drain regions 415 are formed by outdiffusion of n-type dopants from the source and drain electrodes (i.e., bit lines) 417. However, regions 415 may be formed by any other method, such as by masking and ion implantation. The electrodes 417 contact the source and drain regions 415 and are disposed on the bottom of the p-type semiconductor layer 413 (i.e., on the side of layer 413 opposite to the first insulating layer 411). Preferably, the electrodes 417 comprise N+ polysilicon rails which extend in a direction perpendicular to the gate line 403. If desired, an optional metal or metal silicide layer is formed in contact with electrodes 417 to increase their conductivity. However, the electrodes 417 may comprise metal or metal silicide instead of the heavily doped polysilicon, if desired. A planar insulating filler layer 418, such as silicon oxide, is disposed between the source and drain electrodes 417.

Thus, each NMOS TFT 419 is located between adjacent source and drain regions 415 and comprises a portion of layers 405, 411, 413 and 417, as illustrated in FIG. 11. The PMOS TFTS 421 are located above the NMOS TFTs 419.

The PMOS TFTs 421 include a second insulating layer 423 adjacent to a second side of the gate electrode 403. In FIG. 11, layer 423 is located on the P+ polysilicon layer 409 of the gate line 403. The insulating layer 423 may be a conventional gate dielectric. Preferably, the insulating layer 423 is a charge storage layer (i.e., charge trapping media), such as an ONO stack or isolated nanocrystals, to form charge storage CMOS TFTS, such as EEPROM CMOS TFTs. If floating gate type EEPROM CMOS TFTs are desired, then a floating gate and a control gate dielectric may be added between the insulating layer 423 and the gate line 403.

An n-type semiconductor layer 425, such as an N– polysilicon layer, is disposed above the second insulating layer 423. Layer 425 is disposed on the opposite side of layer 423 from the gate electrode 403. P+ source and drain regions 427 are disposed in layer 425, such that regions of layer 425 between the source and drain regions 427 comprise channel regions of PMOS TFTs. Source and drain electrodes 429 are disposed over the N– polysilicon layer 425 and in contact with the source and drain regions 429. Thus, the electrodes 429 are disposed on top side of the N– polysilicon layer 425 opposite to the second insulating layer 423. A planar insulating filler layer 431, such as silicon oxide, is disposed between the source and drain electrodes 429. If desired, an optional metal or metal silicide layer is formed in contact with electrodes 429 to increase their conductivity.

Thus, each PMOS TFT 421 is located between adjacent source and drain regions 427 and comprises a portion of layers 409, 423, 425 and 429, as illustrated in FIG. 11. A TFT EEPROM CMOS device (419 and 421) is formed at each intersection of the first and the third spaced-apart electrodes or conductors 417, 429 and the common gate line 403. If desired, the CMOS structure may be inverted and the PMOS TFTs formed below NMOS TFTs. It should be noted that NMOS and PMOS electrodes (i.e., bit lines) do not have to fall directly on top of each other, although they preferably should have the same pitch. NMOS and PMOS transistors thus can have different channel lengths, but the pitch (and thus array size) will be limited by the longer of the two channel lengths. In one preferred aspect, TFTs of one conductivity type (i.e., NMOS or PMOS TFTs) contain a charge storage layer or region, while TFTs of the other conductivity type (i.e., PMOS or NMOS) do not have a charge storage region or layer. Thus, the CMOS of this aspect comprises one EEPROM TFT and one non-EEPROM TFT.

The TFT CMOS device array 400 illustrated in FIG. 11 is highly planar and compact. The NMOS source and drain electrodes 417 comprise polysilicon rails which extend above the interlayer insulating layer 401 in a first plane parallel to the substrate surface. The p-type polysilicon layer 413 extends above the source and drain electrodes 417 in a second plane. The gate line 403 extends above layers 417, 413 and 411 in a third plane. The n-type polysilicon layer 425 extends above the gate line 403 in a fourth plane. The PMOS source and drain electrodes 429 comprise polysilicon rails which extend above the n-type semiconductor layer 425 in a fifth plane. Each of the five planes does not intersect any of the other planes.

The TFT CMOS array 400 is also self aligned. The gate electrode 403, the first insulating layer 411, the p-type semiconductor layer 413, the second insulating layer 423 and the n-type semiconductor layer 425 comprise a rail stack which is located in a plane parallel to the substrate. The rail stack extends perpendicular to the source and drain electrodes 417, 429. Thus, the gate electrode 403, the first insulating layer 411, the p-type semiconductor layer 413, the second insulating layer 423 and the n-type semiconductor layer 425 are self aligned in a plane perpendicular to the substrate and parallel to the source to drain direction.

Figure 12:
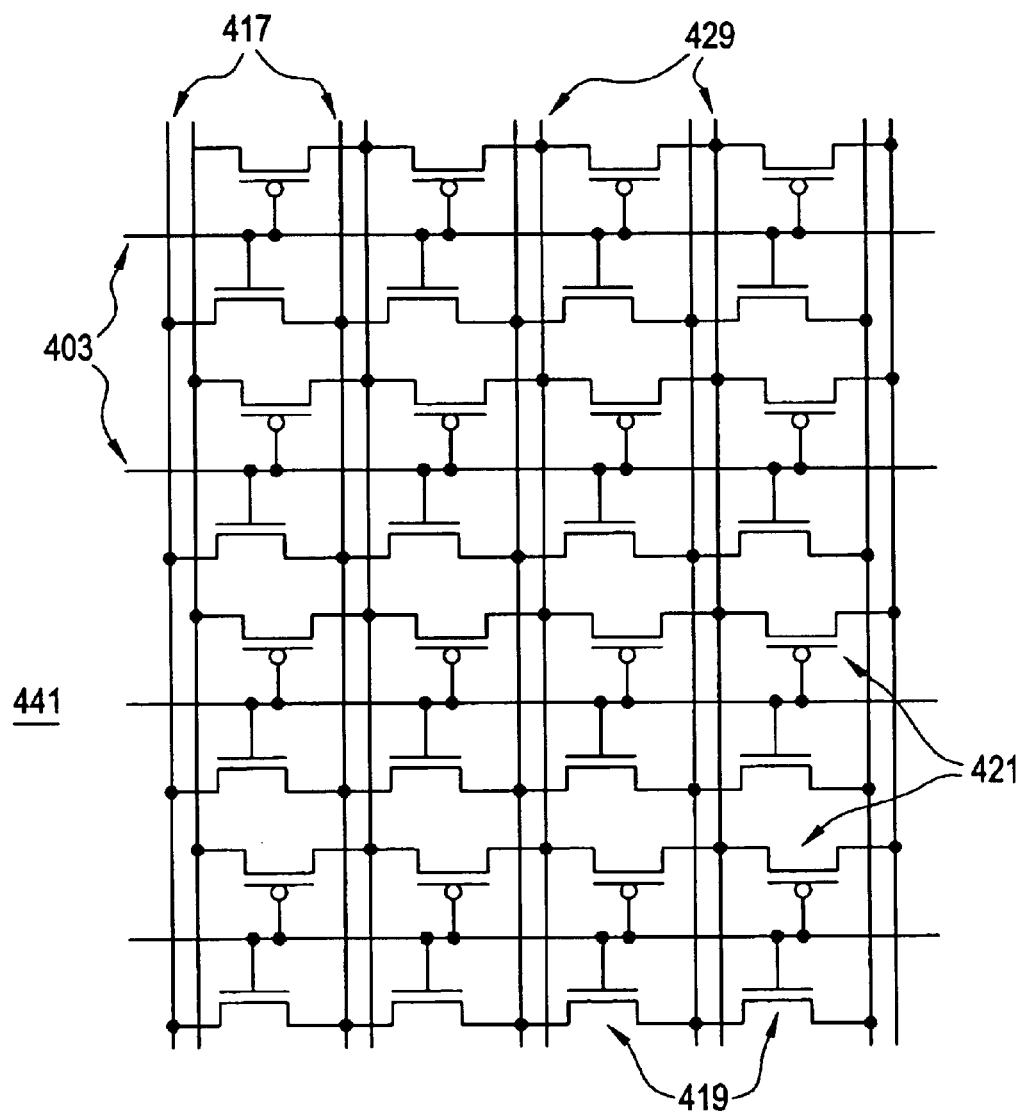
FIGS. 12 to 14 are circuit diagrams of logic circuits using the TFT CMOS EEPROM array of the ninth preferred embodiment.

As shown in FIG. 12, the resulting TFT CMOS array is a matrix of NMOS 419 and PMOS 421 devices with common gates 403. The array shown in FIG. 12 is an unprogrammed or unconfigured array. The array can then be configured into logic elements or memory devices by rupturing the gate dielectric (i.e., the charge storage film or region) to form a conductive link which connects the gate lines (i.e., word rows) 403 and source and drain electrodes 417, 429 (i.e., bit lines), or by storing charge in the charge storage regions of either NMOS or PMOS transistors to raise their threshold voltages and keep them permanently off. The array of TFT CMOS EEPROM devices 400 may be used to form either logic elements or a memory array. Furthermore, the same semiconductor device in the unconfigured array may be used either as an antifuse or as an EPROM or an EEPROM.

According to an aspect of the ninth preferred embodiment of the present invention, a driver circuit comprising a plurality of charge storage devices and a plurality of antifuse devices is provided. The circuit may comprise a field programmable gate array or a programmable logic device. Preferably, the plurality of charge storage devices and the plurality of antifuse devices comprise a same set of devices. This greatly simplifies the fabrication of the circuit. These devices function as charge storage devices when a first programming voltage is applied to the devices to turn these devices off by increasing their threshold voltage. These devices also function as antifuses when a second programming voltage higher than a first voltage is applied to the devices. The second voltage may be any voltage which is sufficient to form a conductive link through the charge storage region. For example, the first (i.e., charge storage voltage) may be less than 5 volts, while the second voltage sufficient to form the conductive link may be 5–50 volts, depending on the device characteristics. However, if desired, charge storage and antifuse semiconductor devices having a different structure may be provided.

It should be noted that any charge storage devices which function as an antifuse when a conductive link has been formed through its charge storage region are within the scope of the ninth preferred embodiment. Thus, any device is within the scope of the ninth preferred embodiment if the device contains a semiconductor active region, a charge storage region adjacent to the semiconductor active region, a first electrode and second electrodes, and where charge is stored in the charge storage region when a first programming voltage is applied between the first and the second electrodes, and a conductive link is formed through the charge storage region to form a conductive path between the first and the second electrodes. Therefore, a charge storage device which is capable of being used as an antifuse is not limited to rail stack TFT EEPROMs. Such charge storage devices may include the pillar or self aligned TFT EEPROMs and diodes with charge storage regions of the previous embodiments.

Figure 13:
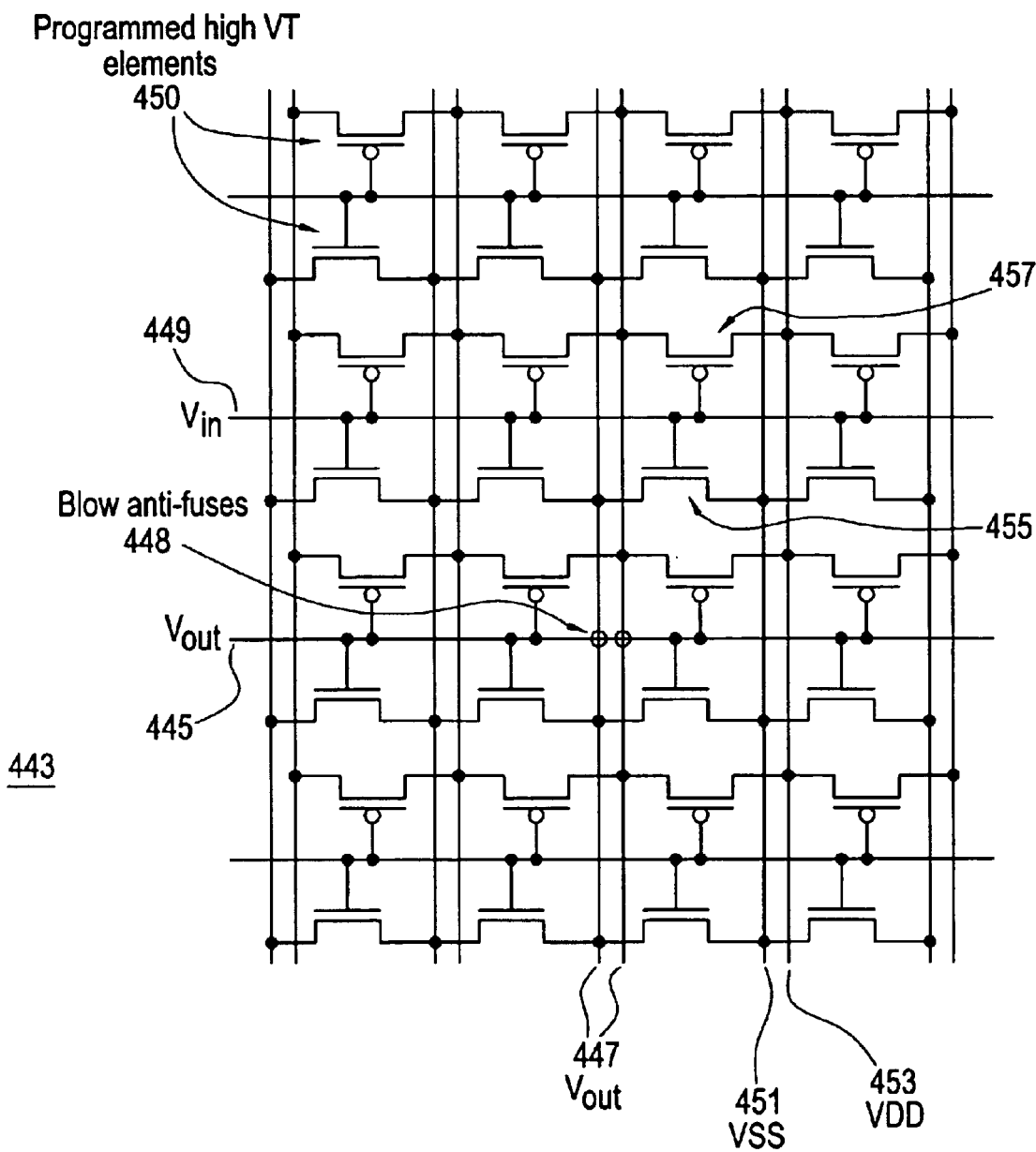

FIG. 13 illustrates how a 4×4 cell array of the circuit of FIG. 12 can be programmed into an inverter 443. First, a high voltage is applied between gate (i.e., word) line 445 and bit lines 447, which will be used to carry the output voltage, $V_{out}$. This causes conductive antifuse links 448 to form to electrically connect lines 445 and 447. Then, a programming voltage is applied to all other transistors 450 to increase their threshold voltage to turn them off, except to NMOS transistors 455 and PMOS transistors 457. The NMOS 455 and PMOS 457 transistors form the inverter. When a high voltage, $V_{in}$, is provided into gate line 449, then a low voltage, $V_{out}$, is read out, and vice-versa. Voltages $V_{SS}$ (i.e., ground) and $V_{DD}$ (i.e., power supply voltage) are provided into bit lines 451 and 453 which are connected to transistors 455 and 457.

Figure 14:
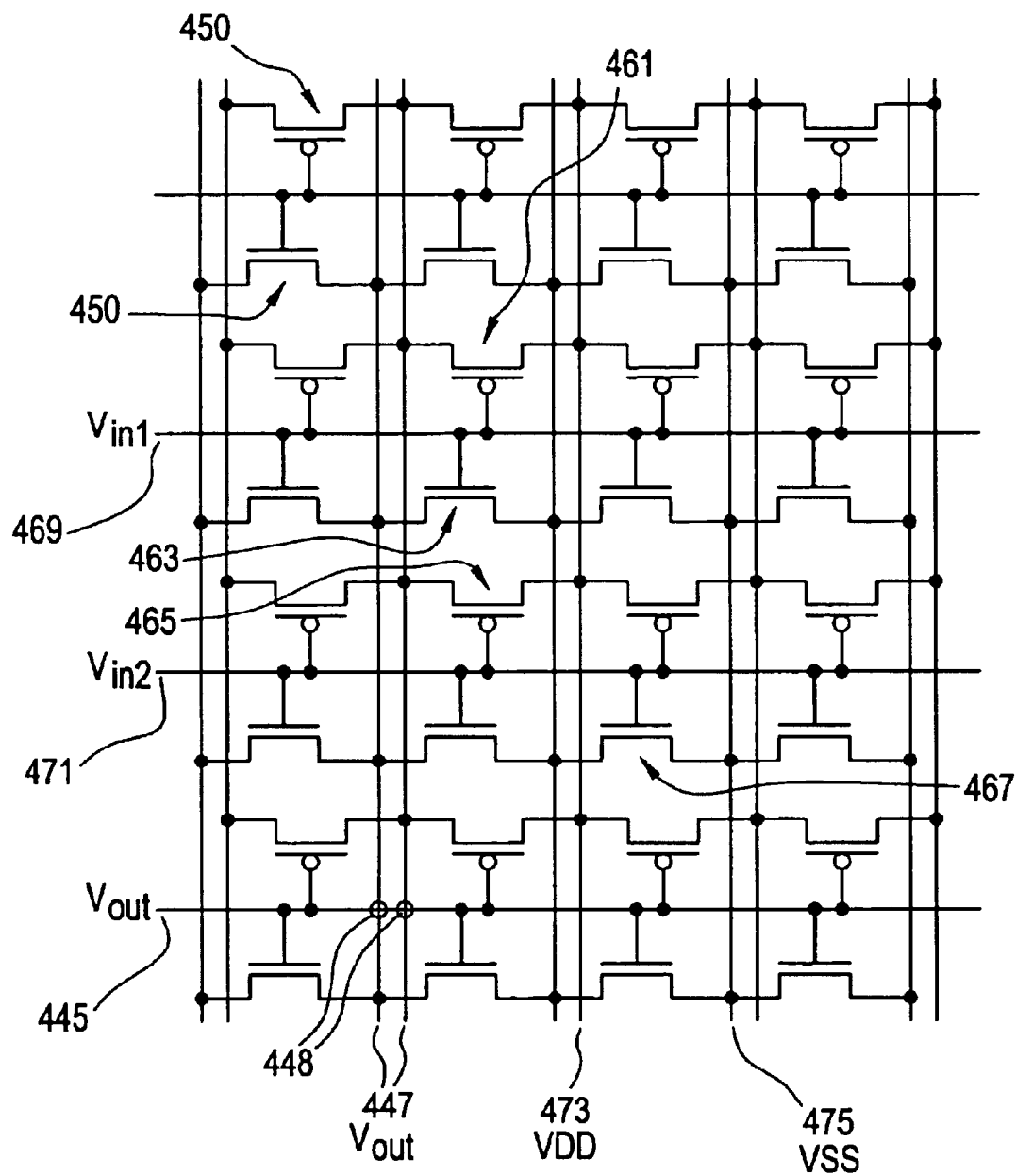

FIG. 14 illustrates how a 4×4 cell array of the circuit of FIG. 12 can be programmed into a two input NAND gate 460. First, a high voltage is applied between gate (i.e., word) line 445 and bit lines 447, which will be used to carry the output voltage, $V_{out}$. This causes conductive antifuse links 448 to form to electrically connect lines 445 and 447. Then, a programming voltage is provided to all other transistors 450 to increase their threshold voltage to turn them off, except for PMOS transistors 461 and 465 and NMOS transistors 463 and 465. The transistors 461, 463, 465 and 467 form the NAND gate. Input voltages $V_{in1}$ and $V_{in2}$ are provided into gate lines 469 and 471. CMOS 461/463 is connected to gate line 469, while transistors 465 and 467 are connected to gate line 471. Voltages $V_{SS}$ and $V_{DD}$ are provided into bit lines 473 and 475. NMOS 467 is connected to bit line 475, while PMOS 461 and 465 are connected to bit line 473. Output voltages can be read out from lines 445 or 447, which are connected by a blown antifuse 448.

By forming the driver circuits in an SOI or a compound semiconductor substrate, numerous advantages may be realized. For example, by forming the driver circuits in SOI substrates, the leakage current between the devices of the driver circuits is improved compared to the devices formed in a monocrystalline silicon substrate. Furthermore, the radiation hardness of the devices formed in an SOI substrate is improved compared to the radiation hardness of the devices formed in a monocrystalline silicon substrate.

By forming the driver circuits in a silicon carbide substrate, the leakage current and radiation hardness of the driver circuits is improved compared to the driver circuits formed in a silicon substrate. Furthermore, the driver circuits formed in a silicon carbide substrate can withstand a higher operating voltage than the driver circuits formed in a silicon substrates. Thus, the memory array of the preferred embodiments may be used in an environment where it will be subjected to high radiation doses, such as in military devices and in space craft, by forming the driver circuits in an SOI or a silicon carbide substrate.

By forming the driver circuits in III-V semiconductor substrates, such as GaAs substrates, the operating speed of the driver circuits is higher than the operating speed of the driver circuits formed in a silicon substrate. Thus, the memory array of the preferred embodiments may be used in an environment where high device operating speed is required.

Figure 15:
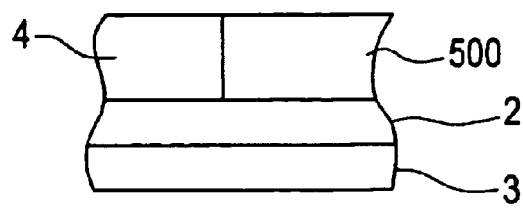
FIG. 15 is a schematic side cross sectional view of a memory array monolithically integrated with a non-memory device.

An additional advantage of forming driver circuits in SOI or compound semiconductor substrates is that the memory array may be monolithically integrated (i.e., formed over the same substrate) with additional devices which are ordinarily formed on SOI or compound semiconductor substrates. For example, as shown in FIG. 15, the driver circuit(s) 2, the memory array 4 and the additional device(s) 500 are monolithically formed on the same substrate, which contains an insulating surface 3. Thus, the additional device 500 is formed over the same substrate as the driver circuits 2 by depositing a semiconductor layer over the substrate and forming the device 500 in the deposited semiconductor layer.

In one preferred aspect, the additional device 500 which is ordinarily formed on SOI or compound semiconductor substrate is a non-memory device, such as an optoelectronic component. An optoelectronic component may comprise a laser, an light emitting diode (LED) or a semiconductor photodetector. These devices are ordinarily formed on a III-V semiconductor, glass, plastic or ceramic substrates. Thus, the driver circuit 2 is also formed on a III-V, glass, plastic or ceramic substrate.

In another preferred aspect, the additional device 500 which is ordinarily formed on a compound semiconductor substrate is a microwave circuit (such as a monolithic microwave integrated circuit or MMIC) or a radio frequency circuit. Thus, the driver circuit 2 is also formed in a III-V substrate.

In another preferred aspect, the additional device 500 which is ordinarily formed on an SOI substrate, such as a glass, plastic or ceramic substrate, is a liquid crystal display ("LCD"). Since an LCD usually has TFT driver circuits and TFTs in the display matrix, it is preferable to form the driver circuits 2 of the memory array during the same step as the LCD driver circuits, and to form the TFT EEPROMs of one level of the seventh embodiment during the same step as the matrix TFTs of LCD.

In another preferred aspect, the additional device 500 which is ordinarily formed on an SOI substrate, such as a flexible plastic substrate is a smart card processing circuit. Thus, the memory array and the smart card chip may be formed on the same plastic substrate for use as a smart card.

In the various embodiments described above, a metal silicide layer was formed in contact with a silicon layer, such as a polysilicon word line or bit line. One preferred method of forming a titanium silicide layer in contact with a silicon layer is by using a silicon cap and a TiN layer. The titanium silicide layer is formed on an undoped amorphous silicon cap layer. The cap layer is formed on a heavily doped silicon layer, such as a polysilicon or amorphous silicon layer doped to a concentration in excess of $10^{19}$ cm$^{-3}$, such as $10^{19}$ cm$^{-3}$ to $10^{21}$ cm$^{-}$. The cap layer is preferably deposited on P+ polysilicon or N+ amorphous silicon layers. The N+ amorphous silicon may then be recrystallized into N+ polysilicon during subsequent annealing steps.

A method of forming a titanium silicide (TiSi$_2$) layer comprises the following steps. A heavily doped polysilicon layer is deposited. For example, a P+ polysilicon layer is boron doped to a concentration of $5\times10^{20}$ cm$^{-3}$, and has a thickness of about 1400 Angstroms. A cap layer of undoped amorphous silicon is deposited on the P+ polysilicon layer. The cap may be 600 Angstroms thick, for example. A titanium layer is deposited on the cap. The titanium layer may be 250 Angstroms thick, for example. A titanium nitride layer is deposited on the titanium layer. The titanium nitride layer may be 100 Angstroms thick, for example. Other layer thicknesses may be used, as required.

The layers are annealed at a temperature below 650° C. for less than five minutes to react the titanium and the silicon in the cap to form a C49 phase TiSi$_2$ layer. The anneal may be carried out at 600° C. for 1 minute, for example. If desired, another P+ polysilicon layer is deposited over the stack and the stack is etched into a thin "wire" or "rail", such as a word line or bit line. The wire or rail may be 0.25 mm wide or less. The titanium silicide is then transformed from the C49 to the C54 phase by a high temperature (i.e., above 650° C.) anneal. The anneal can take place before or after the wires or rails are patterned, at 800° C. for one minute, for example. By annealing each Si/Ti/TiN film stack below 650° C., dopant diffusion and thermal grooving of the TiSi$_2$ is minimized. Multiple film stacks can be deposited and etched sequentially.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the device in schematic block format. It is intended that the scope of the invention be defined by the claims appended hereto, and their equivalents.

What is claimed is:
1. A nonvolatile memory array, comprising:
an array of nonvolatile memory devices;
at least one driver circuit; and
a substrate;
wherein the at least one driver circuit is not located in a bulk monocrystalline silicon substrate, wherein the array of nonvolatile memory devices comprises an array of PROMS, EPROMS or EEPROMs, wherein the array of nonvolatile memory devices comprises a monolithic three dimensional array of memory devices.
2. The array of claim 1, wherein the array of nonvolatile memory devices comprises a three dimensional array of antifuses.
3. The array of claim 2, wherein the array of antifuses comprise a first set of rail stack conductors, a second set of rail stack conductors extending in a different direction than the first set of rail stack conductors, and an insulating layer disposed between the first and the second sets of rail stacks.
4. The array of claim 3, further comprising semiconductor diodes located at intersections of the conductors of the first and the second sets of rail stacks.
5. The array of claim 4, wherein the diodes comprise P+/N− diodes.
6. The array of claim 1, wherein each device of the three dimensional array comprises:
a first conductor;
a second conductor; and
a pillar vertically disposed between the first and the second conductors;
wherein the pillar comprises:
a semiconductor diode having a first conductivity type region and a second conductivity type region;
a tunneling oxide;
a charge storage region; and
a blocking oxide.
7. The array of claim 6, wherein each charge storage region comprises:
an ONO dielectric film;
an insulating layer containing conductive nanocrystals; or
an isolated floating gate comprising:
a tunnel dielectric above the channel;
the floating gate above the tunnel dielectric; and
a control gate dielectric above the floating gate.
8. The array of claim 1, wherein each memory device of the three dimensional array comprises:
a source region, a channel region and a drain region each vertically aligned with one another to form a pillar;
a first electrode contacting the source region;
a second electrode contacting the drain regions;
a charge storage region located adjacent to and in contact with the channel region; and
a control gate located adjacent to and in direct contact with the charge storage region.
9. The array of claim 1, wherein the array of nonvolatile memory devices comprises an array of TFT EEPROMs.
10. The array of claim 9, wherein the array comprises:
a plurality of vertically separated device levels, each level comprising an array of TFT EEPROMs, each TFT EEPROM comprising a channel, source and drain regions, a control gate, and a charge storage region between the channel and the control gate;
a plurality of bit line columns in each device level, each bit line contacting the source or the drain regions of the TFT EEPROMs;

a plurality of word line rows in each device level; and at least one interlayer insulating layer located between the device levels.

11. The array of claim 10, wherein:

the channel of each TFT EEPROM comprises amorphous silicon or polysilicon;

the columns of bit lines extend substantially perpendicular to a source-channel-drain direction of the TFT EEPROMs;

each word line contacts the control gates of the TFT EEPROMs, and the rows of word lines extend substantially parallel to the source-channel-drain direction of the TFT EEPROMs; and the word lines are self aligned to the control gates of the array of TFT EEPROMs and the word lines are self aligned to the channel and the charge storage regions of the TFT EEPROMs located below the respective word lines.

12. The array of claim 1, wherein the array of nonvolatile memory devices comprises a flash memory array which is programmed by FN tunneling.

13. The array of claim 12, wherein the array comprises:

a first plurality of spaced-apart conductive bit lines disposed at a first height above the substrate in a first direction; and a second plurality of spaced-apart rail-stacks disposed at a second height in a second direction different from the first direction, each rail-stack including a plurality of semiconductor islands whose first surface is in contact with said first plurality of spaced-apart conductive bit lines, a conductive word line, and charge storage regions disposed between a second surface of the semiconductor islands and the word line.

14. A nonvolatile memory my, comprising:

an array of nonvolatile memory devices;

at least one driver circuit; and a substrate;

wherein the at least one driver circuit is not located in a bulk monocrystalline silicon substrate, wherein the array of nonvolatile memory devices comprises an array of PROMs, EPROMs or EEPROMs, wherein the array comprises:

a first plurality of spaced-apart conductors disposed at a first height above the substrate in a first direction; and a second plurality of spaced-apart rail-stacks disposed above the first height in a second direction different from the first direction, each rail-stack including a semiconductor film of a first conductivity type in contact with said first plurality of spaced-apart conductors, a local charge storage film disposed above the semiconductor film and a conductive film disposed above the local charge storage film.

15. The array of claim 14, wherein:

a space between said spaced-apart conductors contains a planarized deposited oxide material;

said semiconductor film comprises polysilicon; and said local charge storage film is selected from a group consisting of a dielectric isolated floating gate, an ONO dielectric film and an insulating layer containing conductive nanocrystals.

16. A nonvolatile memory array, comprising:

a monocrystalline silicon substrate;

at least one driver circuit formed above the substrate; and an array of nonvolotile memory devices formed above the substrate, wherein the array of nonvolotile memory devices comprises a monolithic three dimentional array of memory devices.

17. The array of claim 16, wherein the array of nonvolatile memory devices comprises a three dimensional array of antifuses.

18. The array of claim 17, wherein the array of antifuses comprise a first set of rail stack conductors, a second set of rail stack conductors extending in a different direction than the first set of rail stack conductors, and an insulating layer disposed between the first and the second sets of rail stacks.

19. The array of claim 18, further comprising semiconductor diodes located at intersections of the conductors of the first and the second sets of rail stacks.

20. The array of claim 19, wherein the diodes comprise P+/N− diodes.

* * * * *

UNITED STATES PATENT AND TRADEMARK OFFICE
CERTIFICATE OF CORRECTION

PATENT NO.         : 6,888,750 B2
APPLICATION NO.    : 09/927642
DATED              : May 3, 2005
INVENTOR(S)        : Andrew J. Walker et al.

It is certified that error appears in the above-identified patent and that said Letters Patent is hereby corrected as shown below:

In the Specification

Col. 9, line 32: please change "10" to --83--

Col. 16, line 7: please change "429" to --427--

Col. 18, line 2: please change "465" to --467--

Col. 19, line 24: please change "cm" to --$cm^{-3}$--

In the Claims

Column 22, line 28 (claim 16, line 7): please change "dimentional" to --dimensional--

Signed and Sealed this
Seventh Day of April, 2015

Michelle K. Lee
*Director of the United States Patent and Trademark Office*